(12) United States Patent  
Boyd

(10) Patent No.: US 12,501,594 B2  
(45) Date of Patent: Dec. 16, 2025

(54) DEVICES, SYSTEMS AND METHODS FOR REDUCING CONDUCTED AND RADIATED EMISSIONS AND SUSCEPTIBILITY

(71) Applicant: FACE INTERNATIONAL CORPORATION, Norfolk, VA (US)

(72) Inventor: Clark D Boyd, Portsmouth, VA (US)

( * ) Notice: Subject to any disclaimer, the term of this patent is extended or adjusted under 35 U.S.C. 154(b) by 543 days.

(21) Appl. No.: 17/512,652

(22) Filed: Oct. 27, 2021

(65) Prior Publication Data

US 2022/0053674 A1    Feb. 17, 2022

Related U.S. Application Data

(63) Continuation of application No. PCT/US2021/025284, filed on Mar. 31, 2021.

(60) Provisional application No. 63/014,443, filed on Apr. 23, 2020, provisional application No. 63/003,278, filed on Mar. 31, 2020.

(51) Int. Cl.
| | |
|---|---|
| *H05K 9/00* | (2006.01) |
| *H10N 30/00* | (2023.01) |
| *H10N 30/88* | (2023.01) |

(52) U.S. Cl.
CPC ......... *H05K 9/0018* (2013.01); *H10N 30/101* (2024.05); *H05K 9/0049* (2013.01); *H05K 9/0081* (2013.01); *H10N 30/88* (2023.02)

(58) Field of Classification Search
CPC .. H05K 9/0018; H05K 9/0049; H05K 9/0081; H10N 30/50; H10N 30/1071; H10N 30/88; H01L 25/04
See application file for complete search history.

(56) References Cited

U.S. PATENT DOCUMENTS

| | | | |
|---|---|---|---|
| 3,521,089 A | 7/1970 | Stuetzer | |
| 5,650,685 A * | 7/1997 | Kosinski | H01L 25/16 310/317 |

(Continued)

OTHER PUBLICATIONS

International Search Report and Opinion, PCT/US2021/025284, main date Dec. 7, 2021.

*Primary Examiner* — James Wu  
(74) *Attorney, Agent, or Firm* — Lowndes; Stephen C. Thomas; R. Richard Fredeking

(57) ABSTRACT

A device, system and method for protecting electronic systems from failure or damage when such systems are subjected to undesired conducted or radiated energy such as electromagnetic pulse or electromagnetic interference. The invention also reduces the amount of conducted or radiated emissions from an electronic system. A novel, non-conductive signal feedthrough allows a desired signal to be communicated with electrical connectivity. An incoming desired electrical signal is converted to vibrational energy by a piezoelectric transducer, which is communicated into the interior volume of a conductive electrical enclosure housing a system to be protected, where it is converted back to electrical for processing by the system to be protected by a second piezoelectric transducer. The signal feedthrough allows a continuous conductive enclosure to be employed, providing protection from undesired radiated energy. The signal feedthrough allows communication without requiring electrical conduction through the feedthrough, thus protecting against undesired conducted energy.

25 Claims, 8 Drawing Sheets

(56) References Cited

U.S. PATENT DOCUMENTS

| | | | |
|---|---|---|---|
| 6,215,227 B1 * | 4/2001 | Boyd | H10N 30/40 |
| | | | 310/366 |
| 2003/0048037 A1 | 3/2003 | Boyd | |
| 2013/0176086 A1 | 7/2013 | Bradley et al. | |
| 2016/0133579 A1 * | 5/2016 | Akiba | H01L 24/94 |
| | | | 257/659 |

* cited by examiner

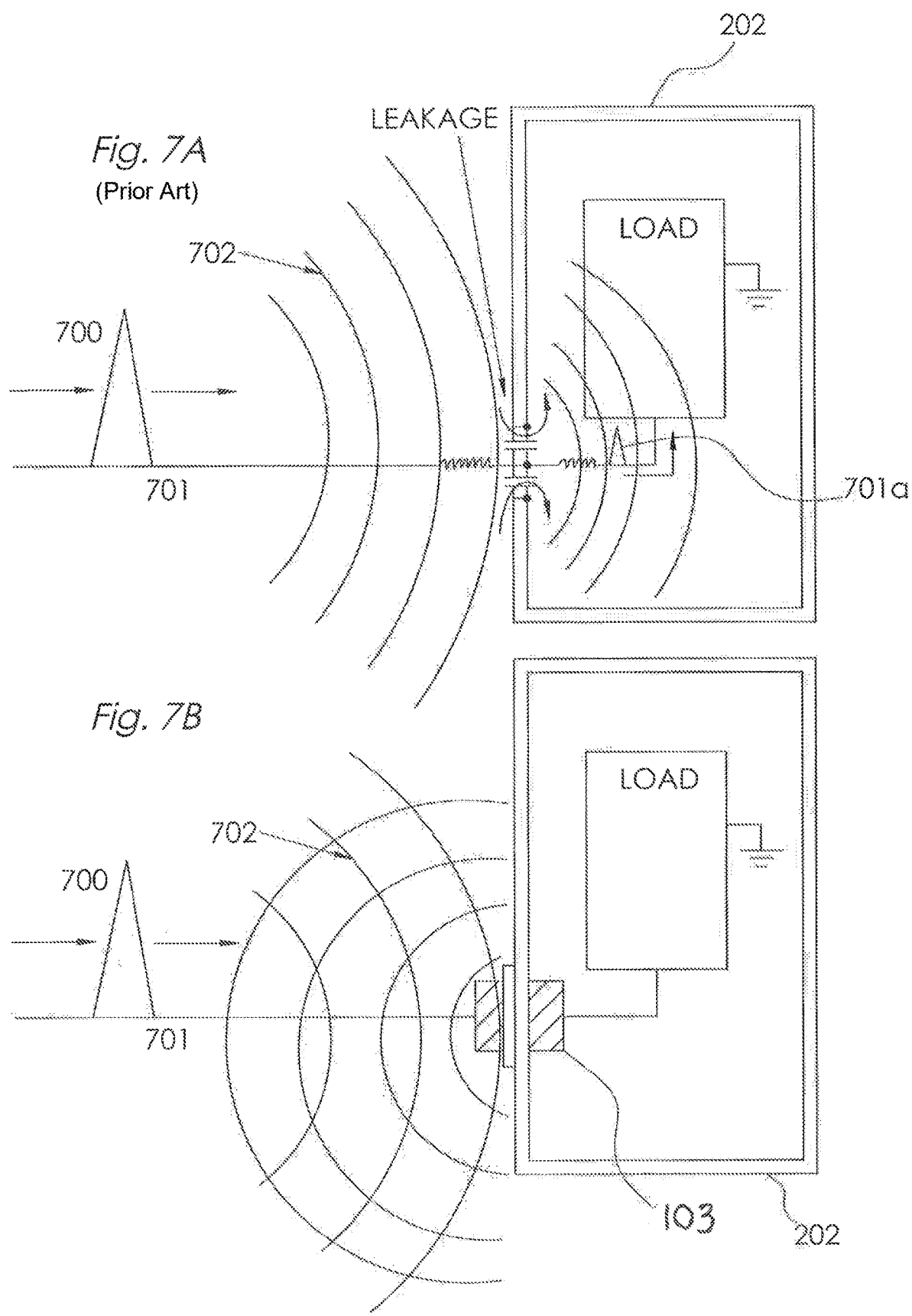

DEVICES, SYSTEMS AND METHODS FOR REDUCING CONDUCTED AND RADIATED EMISSIONS AND SUSCEPTIBILITY

CROSS REFERENCE TO RELATED APPLICATIONS AND INCORPORATION BY REFERENCE

This non-provisional patent application is a continuation of, and claims benefit of priority to, pending international application for patent PCT/US21/25284 which was filed in the Unites States Patent and Trademark Office (USPTO), which was the United States Receiving Office (USRO) for the international application, on Mar. 31, 2021, entitled "DEVICES, SYSTEMS AND METHODS FOR REDUCING CONDUCTED AND RADIATED EMISSIONS AND SUSCEPTIBILITY", which is incorporated by reference herein in its entirety, which is a non-provisional of and claims benefit of priority to U.S. provisional patent application Ser. No. 63/003,278, entitled "DEVICES, SYSTEMS AND METHODS FOR REDUCING CONDUCTED AND RADIATED EMISSIONS AND SUSCEPTIBILITY" which was filed in the United States Patent and Trademark Office (USPTO) on Mar. 31, 2020, the disclosure of which is incorporated by reference herein in its entirety; PCT/US21/25284 is also a non-provisional of and claims benefit of priority to U.S. provisional patent application Ser. No. 63/014,443, entitled "DEVICES, SYSTEMS AND METHODS FOR REDUCING CONDUCTED AND RADIATED EMISSIONS AND SUSCEPTIBILITY" which was filed in the United States Patent and Trademark Office (USPTO) on Apr. 23, 2020, the disclosure which is also incorporated by reference herein in its entirety. This patent application also incorporates herein by reference in its entirety all of the disclosure of U.S. Pat. No. 6,836,054, entitled "Thickness Mode Piezoelectric Transducer with Resonant Drive Circuit" which issued from the United States Patent and Trademark Office on Dec. 28, 2004.

STATEMENT REGARDING FEDERALLY SPONSORED RESEARCH OR DEVELOPMENT

Not applicable.

INCORPORATION-BY-REFERENCE OF MATERIAL SUBMITTED ON A COMPACT DISK

Not applicable.

BACKGROUND OF THE INVENTION

1. Field of the Invention

The field of the invention relates generally to devices, systems and methods for preventing undesired conducted or radiated energy, such as unwanted radiated or conducted energy resulting from Electromagnetic Pulse (EMP) events, from disrupting or damaging electrical systems. The field of the invention also relates generally to the devices, systems and methods for preventing undesired conducted or radiated emanations from a system from leaving the system, where they may be detected by unfriendly eavesdropping receivers.

2. Background

The susceptibility of electrical power systems, electronic circuits, semiconductors and other systems and device(s) to undesired radiated and conducted energy has long been known, and has been a source of concern as it relates to the continued operation of such systems. Increasingly, systems that are generally considered crucial for the continued, uninterrupted operation of channels of trade, banking, securities exchanges, and national security are based on communication, computing, data storage and like systems that are comprised of electrical power systems, electronic circuits, memory media, semiconductors and other devices that are susceptible to dielectric breakdown, catastrophic shorting, conductor trace failure and other catastrophic failures caused by directly conducted or induced currents and voltages they may experience when subjected to high levels of undesired radiated and conducted energy. Even if the undesired radiated and conducted energy is not of sufficient magnitude to result in the non-operability of a system to be protected, such energy may generate sufficient electrical noise in the system to be protected that desired signals are no longer detectible or usable, causing disruption of normal operation. Undesired radiated or conducted energy is any energy of sufficient magnitude such that it causes the aforementioned effects on a system to be protected.

Such undesired conducted or radiated energy may result from manmade causes, such as electromagnetic radiation from manmade sources, including both unintentional and intentional radiation including but not limited to electromagnetic pulse (EMP) energy and energy resulting in electromagnetic interference (EMI); or such unwanted conducted or radiated energy may result from natural sources such as solar flares, lightning or other natural causes. It is desirable that such unwanted conducted or radiated energy be kept from entering electronics enclosures that house systems to be protected that may comprise sensitive electronic circuitry.

EMI may result from radiated energy resulting from electrical current switching, electrical frequency sources such at those used to provide radio reference frequencies, clock signals for digital systems, lightning, atmospheric noise, intentional radiation of electromagnetic energy, for example in various weapon systems. EMI may be pulsed or continuous in nature. Further, EMI may be narrowband, such as is the case when caused by a single carrier signal or other narrowband source such as oscillators and clock signals used in electronic circuits, or spurious signals caused by intermodulation in transmitters such as mobile phones or Wi-Fi routers. EMI may also be broadband in nature such as the EMI resulting from naturally occurring energy sources of which solar plasma ejections are an example.

When considering schemes for protecting a system from the damaging effects resulting from the subjecting of the system to undesired radiated and conducted energy, it is important to understand how such undesired radiated and conducted energy is coupled into such systems. The coupling of undesired radiated and conducted energy into a system to be protected may occur, among other things, by the coupling of electromagnetic energy onto electrical conductors providing power or communications signals to the system and by the coupling of electromagnetic energy to the electrical conductors and semiconductors forming the system itself such as occurs when a conductor is subjected to a time-varying magnetic field. If it were possible to house a system to be protected in an electrically conductive enclosure such that the system were completely surrounded by a continuous conductive sheet enclosure with no electrical connection to the environment outside the enclosure, i.e. no electrical path passing through the continuous conductive sheet enclosure from the enclosed interior volume of the enclosure to the space outside the enclosure, the system housed inside the enclosed interior volume of the enclosure would be protected because 1) there would no unwanted conducted energy communicated to the system due to the lack of electrical conduction between the system and the environment outside the enclosure; and 2) there would be no unwanted radiated energy communicated to the system due to the continuously conductive enclosure having no openings. However, as regarding systems and enclosures of the prior art, such a system would not be able to receive power, and would not be able to communicate to any other system outside the enclosure. Thus, such a system would be rendered useless by the scheme used to protect it.

In order for systems to have utility, they must be able to communicate with other systems; i.e., they must be able to sink (i.e. receive) signals from other systems, or source (i.e. transmit) signals to other systems, or both. This means that, in order to be useful, they generally must be in communication with systems outside any enclosure in which they are housed. In particular, in order for a system to be protected from unwanted conducted and radiated EMI and EMP, and in order to prevent conducted and radiated emanations from the system, it is desired that the system be completely surrounded by an continuous electrically conductive surface such as, for example, an enclosure forming an enclosed interior volume in which the system may be disposed. In order to protect against unwanted radiated electromagnetic energy, and to prevent radiated electromagnetic energy generated by the system to be receivable by others outside the enclosure, it is desired that the continuous electrically conductive surface have no openings or holes passing through it. In order to protect against unwanted conducted electrical energy, and to prevent energy generated by the system to be receivable by others outside the enclosure, it is desired that there be no electrically conductive path through the continuous electrically conductive surface or enclosure. However it is desired that electrical power and signals are able to be communicated through the continuous electrically conductive surface or enclosure from either outside the continuous electrically conductive surface or enclosure to the enclosed interior volume of the surface or enclosure, or from the enclosed interior volume formed by the continuous electrically conductive surface or enclosure to others located outside the continuous electrically conductive surface or enclosure. The enclosures of the prior art do not satisfy these desires.

Thus, it is desired to protect such systems from undesired radiated and conducted energy while allowing such systems to receive power from, provide power to, or communicate with, other systems. The inventive system and method of the invention do provide these features.

Systems of the prior art have relied upon various schemes for protecting systems from the damaging effects resulting from the subjecting of the system to undesired radiated and conducted energy, while still allowing such systems to receive power from, provide power to, or communicate with other systems. Exemplary prior schemes have included using electrical filtering on signal lines connecting the system to be protected; using high speed sensing and shutdown circuits that, hopefully, remove power from, or disconnect, the system to be protected before the system is damaged; enclosing the system in a Faraday shield enclosure; converting electrical signals to optical signals using either optical isolators or fiber optic communication systems; or combinations of the above. However, each of these prior schemes have significant drawbacks. Electrical filters, however complex in design for rejecting frequencies that are outside a desired signal band, still provide an electrically conductive path between the system to be protected and the environment outside the enclosure. Further, no filter has infinitely steep cutoff and bandwidth characteristics. Thus, electrical filters will always allow some undesired conducted energy to be communicated to the system to be protected. High-current and high-voltage sensing and shutdown circuits that operate to quickly remove power from, or electrically disconnect, the system to be protected from the conductor. However, such protective circuits require a finite reaction time, and may themselves be damaged by undesired radiated and conducted energy such that they fail to operate or wind up latching to a state that leaves the system disconnected and thus inoperable, or, alternatively, may leave the system connected and thus vulnerable. Such sensing and shutdown circuits may themselves be damaged either by the undesired radiated energy, the conducted energy, or both, as they may comprise sensitive circuitry located outside the system to be protected; and, in any event, optical isolators can only communicate small amounts of power to the system. Faraday shield and cages of the prior art must have openings allowing electrically conductive wiring, optical fibers, or other communication transmission media to pass through. These openings create an opportunity for unwanted radiated or conducted energy, or both, to pass (i.e. leak) into the interior volume of the prior art enclosures, rendering any system to be protected vulnerable to radiated electromagnetic energy such as EMI or EMP; and, further they allow for radiated emissions produced by the system in the interior volume to radiate outside the prior art enclosure.

What is needed in the art, therefore, is an apparatus, system and method that is adapted to prevent a system to be protected from undesired radiated and conducted energy while allowing desired signals to be communicated to the system to be protected, or to be communicated from the system to be protected to users external to the system to be protected.

BRIEF SUMMARY OF THE INVENTION

The present invention comprises a system, apparatus and method that have one or more of the following features and/or steps, which alone or in any combination may comprise patentable subject matter.

The present invention overcomes the shortcomings of the prior art in that it provides a system, apparatus and method for reducing the susceptibility of a system to be protected from undesired radiated and conducted energy, while allowing desired signals to be communicated to the system to be protected, or to be communicated from the system to be protected to users external to the system to be protected.

In accordance with an embodiment of the present invention, the invention is a signal feedthrough capable of providing a desired signal to a system to be protected, while preventing unwanted energy from being provided to the system to be protected. Further, in embodiments, the invention may prevent unwanted energy to be radiated or conducted from, i.e., to be communicated from, a system to be protected, to systems, equipment, circuits or other elements external to the system to be protected. Thus, as used herein, "system to be protected" may include within its meaning any element, device, or system for which protection from unwanted, possibly damaging, external radiated or conducted emissions (or both) is desired, while still allowing a desired signal to pass to the system to be protected at the same time; as well as any element, device, or system for which it is desired to prevent unwanted radiated or conducted emissions (or both) from being communicated to elements, devices, or systems external to the system to be protected, while still allowing a desired signal to pass from the system to be protected at the same time.

In exemplary operation, a desired signal is provided to an electroactive layer, which converts the desired signal to mechanical vibrational energy that is communicated through an electrically conductive layer that, in embodiments, may be connected to an electrical ground, and is either attached to or forms a part of an electrically conductive enclosure forming an enclosed interior volume that may completely enclose a system to be protected with a continuous, uninterrupted, electrically conductive surface having no openings or holes passing therethrough. The mechanical vibrational energy is received by an output electroactive layer, causing the output electroactive layer to vibrate. The output electroactive layer converts the mechanical vibrational energy representing the desired signal to an electrical signal where it may then be communicated to a load, which may be the system to be protected. Thus, the inventive signal feedthrough communicates the desired signal through the electrically conductive enclosure to the system to be protected via an electrically non-conductive mechanical coupling without requiring any openings or holes in the enclosure. In other words there is no electrically conductive path through the signal feedthrough of the invention, or through the electrically conductive surface of the enclosure that forms the enclosed interior volume.

In accordance with an embodiment of the present invention, the signal feedthrough may comprise an input piezoelectric layer and an output piezoelectric layer. The input piezoelectric layer may have a first surface having an electroded surface for electrically connecting to the source of a desired time varying signal. The input piezoelectric layer may have a second surface adjacent to an electrically conductive layer. The input piezoelectric layer may have first axis. The signal feedthrough may have an output piezoelectric layer that has a third surface that is also adjacent to the electrically conductive layer, and located on a side of the electrically conductive layer opposite the side of the electrically conductive layer to which the input piezoelectric layer is adjacent. The electrically conductive layer may comprise, and preferably does comprise, a continuously electrically conductive sheet or surface that passes through the entirety of the cross section of the signal feedthrough, completely covering the cross section of the feedthrough taken transverse to the axis of the signal feedthrough, and may be, but is not necessarily, comprised of a metal or metal alloy. The output piezoelectric layer may also have a second axis. The input and output piezoelectric layers may be coaxially aligned; i.e., the first and second axes may be coaxial. The output piezoelectric layer may have a fourth surface that is electroded for electrically connecting the fourth surface to a sink of the desired time varying signal, which may be, for example, a system to be protected. The first and second surfaces on the input piezoelectric layer may be opposing surfaces that form a thickness of the input piezoelectric layer, and the third and fourth surfaces on the output piezoelectric layer may be opposing surfaces that form a thickness of the output piezoelectric layer. In embodiments, the thickness of the input piezoelectric layer may be the same as the thickness of the output piezoelectric layer. In embodiments, the thickness of the input piezoelectric layer may be less than or greater than the thickness of the output piezoelectric layer. In embodiments, the first and second surfaces of the input piezoelectric layer may be, but are not necessarily, normal to the first axis; and, in embodiments, the first and second surfaces of the output piezoelectric layer may be, but are not necessarily, normal to the axis of the output piezoelectric layer.

There is no electrically conductive path between the electroded first surface on the input piezoelectric layer and the electroded fourth surface on the output piezoelectric layer; however, a time-varying electrical signal applied to the electroded first surface on the input piezoelectric layer is transformed into vibrational energy that is transmitted through the electrically conductive layer to the output piezoelectric layer, resulting in a replica, in some cases a scaled replica, of the time-varying electrical signal being present on the fourth surface of said output piezoelectric layer. Thus, a desired signal may be communicated to the system to be protected without providing any electrically conductive path through the signal feedthrough; thus, no undesired conducted energy is passed to the system to be protected.

In embodiments, the input piezoelectric layer may be at least partially made of a ceramic piezoelectric material, and the output piezoelectric layer may be at least partially made of ceramic piezoelectric material.

In embodiments, the input piezoelectric layer may be polarized in a direction parallel to the first axis, and the output piezoelectric layer may be polarized in a direction parallel to the second axis. The signal input piezoelectric layer and the output piezoelectric layer may be coaxially disposed with one another; i.e, the first axis and second axis may be, but are not necessarily, coaxial.

In embodiments, the invention may comprise a plurality of signal feedthroughs disposed in an electrically conductive layer, allowing for a plurality of desired signals to be communicated through the electrically conductive layer into, or out of, the enclosed interior volume of an electrically conductive enclosure, without requiring any holes or openings in the electrically conductive surface or enclosure that forms the enclosed interior volume in which the system to be protected may be disposed.

In embodiments, the output piezoelectric layer thickness may be greater than the input piezoelectric layer thickness, or vice versa. In an embodiment in which the output piezoelectric layer thickness is greater than the input piezoelectric layer thickness, signal gain from the input piezoelectric layer to the output piezoelectric layer may be achieved (in the case in which a desired signal is being communicated to the system to be protected from outside the system to be protected), and alternatively, signal reduction from the output piezoelectric layer to the input piezoelectric layer may be observed (in the case in which a desired signal is being communicated from the system to be protected to a receiving system or element outside the system to be protected). Likewise, in an embodiment in which the output piezoelectric layer thickness is less than the input piezoelectric layer thickness, signal reduction from the input piezoelectric layer to the output piezoelectric layer may be observed (in the case in which a desired signal is being communicated to the system to be protected from outside the system to be protected), and alternatively, signal gain from the output piezoelectric layer to the input piezoelectric layer may be observed (in the case in which a desired signal is being communicated from the system to be protected to a receiving system or element outside the system to be protected). As used herein, "gain" means a gain of greater than 1. As used herein. "reduction" means gain of less than 1.

In embodiments, a rigid end-mass may be disposed adjacent to, and attached to, the electroded first surface on the input piezoelectric layer, or a rigid end-mass may be disposed adjacent to, and attached to, the electroded fourth surface on the output piezoelectric layer, or both. The rigid end-mass(es) may have a mechanical quality factor greater than a mechanical quality factor of their adjacent piezoelectric layer. The rigid end-mass(es) may be selected so as to achieve a desired resonant frequency of the signal feedthrough. The rigid end-mass(es) may operate to increase the magnitude of resonant vibrations in the output piezoelectric layer.

In embodiments, the invention may comprise a system for reducing the susceptibility of a system to be protected from undesired radiated and conducted energy, while allowing desired energy to be provided to the system to be protected. The system may comprise at least one signal feedthrough, and in some embodiments a plurality of signal feedthroughs, that are attached to or form a part of a wall of an electrically conductive enclosure in such as manner as to communicate a desired signal between an outside system and a system to be protected that is disposed in an enclosed interior volume of the electrically conductive surface or enclosure, while preventing radiated electromagnetic energy from an outside environment to enter the electrically conductive enclosure. In embodiments, the electrically conductive layer of the signal feedthrough has a periphery that is in uninterrupted electrical contact with said electrically conductive enclosure around its periphery, forming a completely uninterrupted electrically conductive three-dimensional continuous surface forming an enclosed interior volume, wherein a system to be protected is completely surrounded by a continuously electrically conductive surface having no gaps, openings or holes, such that radiated electromagnetic energy from said outside environment cannot pass into the enclosed interior volume around, or through, the signal feedthrough, and electromagnetic energy radiated from the system to be protected that is located within the interior volume cannot radiate from within the enclosed interior volume to an area outside the enclosed interior volume of the enclosure.

In embodiments, the invention may comprise a signal feedthrough capable of providing designed energy to a system to be protected, while preventing unwanted energy from being provided to the system to be protected, comprising: an input piezoelectric layer having a first surface and a second surface defining a first thickness of the input piezoelectric layer, the second surface of the input piezoelectric layer opposing the first surface of the input piezoelectric layer, the input piezoelectric layer having a first axis normal to the first and second surfaces; and an output piezoelectric layer having a third surface and a fourth surface defining a second thickness of the output piezoelectric layer, the fourth surface of the output piezoelectric layer opposing the third surface of the output piezoelectric layer, the output piezoelectric layer having a second axis normal to the third and fourth surfaces; wherein the first surface of the input piezoelectric layer is electroded; the second surface of the input piezoelectric layer is in physical contact with an electrically conductive layer; the third surface is in physical contact with the electrically conductive layer; and the fourth surface of the output piezoelectric layer is electroded; and wherein the input piezoelectric layer is mechanically coupled to the output piezoelectric layer through the electrically conductive layer such that an input time-varying electrical signal applied to the first surface is converted to vibrational energy by the input piezoelectric layer, and wherein the vibrational energy is transmitted through the electrically conductive layer to the output piezoelectric layer, wherein the vibrational energy is converted back into a time-varying electrical signal, resulting in a replica of the input time-varying electrical signal being present on the fourth surface of the output piezoelectric layer; wherein there is no electrically conductive path between the electroded first surface on the input piezoelectric layer and the electroded fourth surface on the output piezoelectric layer.

In embodiments, the invention may comprise a system for reducing the susceptibility of a system to be protected from undesired radiated or conducted energy, while allowing desired electrical energy to be provided to the system to be protected, comprising: a continuously electrically conductive enclosure forming a three-dimensional structure having an enclosed interior volume for receiving a system to be protected; the continuously electrically conductive enclosure comprising a wall; a signal feedthrough passing through the wall of the electrically conductive enclosure, the signal feedthrough having an input end and an output end; the signal feedthrough able to be electrically coupled to a source of time-varying electrical energy on the input side, receiving input time-varying electrical energy from the source of time-varying electrical energy, convert the input time-varying electrical energy to time-varying mechanical energy representative of the input time-varying electrical energy, transmit the time-varying mechanical energy to the output end of the feedthrough, and convert, at the output end, the time-varying mechanical energy to output time-varying electrical energy that is representative of the input time-varying electrical energy; wherein the input the and the output side of the feedthrough are located on opposite sides of a wall of the continuously electrically conductive enclosure, such that either the input side of the feedthrough is exterior to the enclosed interior volume and the output the of the feedthrough is inside the enclosed interior volume, or the output side of the feedthrough is exterior to the enclosed interior volume and the input side of the feedthrough is inside the enclosed interior volume; wherein the signal feedthrough does not provide an electrically conductive path from outside the continuously electrically conductive enclosure to inside the continuously electrically conductive enclosure; the signal feedthrough comprising an continuous, uninterrupted electrically conductive layer completely covering a cross section of the feedthrough, wherein the electrically conductive layer comprises a periphery external to the feedthrough that is in uninterrupted electrical contact with a conductive surface of the electrically conductive enclosure, such that radiated energy from outside the electrically conductive enclosure does not pass into the enclosed interior volume. The conversion of electrical energy to mechanical energy and said conversion of mechanical energy to electrical energy is accomplished using piezoelectric materials.

In embodiments, the invention may comprise a method for reducing the susceptibility of a system to be protected from undesired energy, while allowing a desired signal to be provided to the system to be protected, comprising:
  enclosing a system to be protected in an enclosed interior volume of an continuously electrically conductive enclosure such that the system is completely enclosed by a continuously electrically conductive surface that, preferably, has no openings or holes passing through the continuously conductive surface;
  providing a signal feedthrough that allows a desired signal to be communicated to the system to be protected, wherein the signal feedthrough does not provide an electrically conductive path between the outside environment and the system to be protected, and wherein the signal feedthrough does not provide a path for radiated electromagnetic energy to pass from the outside environment to the system to be protected because the signal feedthrough does not require a hole or opening in the continuously electrically conductive sheet forming the enclosed interior volume;

and wherein the signal feedthrough comprises an electrically conductive layer, wherein the electrically conductive layer extending completely across a cross section of the signal feedthrough, and has a periphery that is in uninterrupted electrical contact with the continuous electrically conductive enclosure forming a complete continuous electrically conductive surface surrounding the system to be protected that has no openings or holes passing through the continuously electrically conductive sheet forming the enclosed interior volume, such that radiated electromagnetic energy from the outside environment does not pass into the enclosed interior volume, and radiated electromagnetic energy generated by the system does not pass from the enclosed interior volume to an area outside the enclosed interior volume; and wherein the signal feedthrough communicates said source of desired energy to said system to be protected, or from said system to be protected to a receiving system located outside the enclosed interior volume via an electrically non-conductive mechanical or acoustic coupling.

The step of providing a signal feedthrough may, in embodiments, further be defined as providing a feedthrough mechanically transmitting a desired signal to a system to be protected using piezoelectric materials, and wherein, in embodiments, the signal feedthrough may be any of the embodiments of the signal feedthrough of the invention.

In an embodiment, the signal feedthrough of the invention may be configured such that the electrically conductive layer extends beyond the outer periphery of the input piezoelectric layer and output piezoelectric layer such that it forms a flange for attaching or mounting to an exterior wall of the electrically conductive enclosure. Such attaching may be by any means know in the art such as threaded fasteners, welding, chemical bonding, or any other means. The output piezoelectric layer and optional end-mass of the output side of the signal feedthrough may pass through an opening in the wall of the electrically conductive enclosure, such that the output terminal is accessible from the enclosed interior volume. A conductive EMI gasket may be placed between, and in physical contact and in electrical communication with, the flange and the outer surface of the wall of the electrically conductive enclosure. The EMI gasket may provide continuous electrical contact running outside the periphery of the opening in the electrically conductive enclosure. A further shock and vibration isolating gasket may be interposed between the flange and the outer surface of the wall of the electrically conductive enclosure to prevent mechanical shock and vibration from causing the piezoelectric output signal to contain noise components resulting from such mechanical shock and vibration, causing strain on the piezoelectric materials of the signal feedthrough. Using this configuration of signal feedthrough, existing systems may easily be retrofitted with the signal feedthrough of the invention to improve the EMI and EMP susceptibility of the system to be protected. New systems may also be built with this configuration of signal feedthrough.

It is also the case that certain systems to be protected may generate emanations from the time-varying currents they generate, such as clock and data signals and their harmonics, switching power supply currents, and the like. Such emanations may contain information content that is radiated from the system. These emanations may be received by a hostile receiver and the information content recovered from the received signal. Still further, the information content may be conducted from the system to be protected by electrically conductive connections in the form of conductors carrying signal or power to the system. It is desirable that such emanations and such conducted energy containing information content be prevented from leaving the system to be protected. In embodiments, the signal feedthrough of the invention may be used prevent such emanations and such conducted energy containing information content from leaving the enclosed interior volume. In this use case, a signal feedthrough of the invention is utilized such that the electroded fourth surface of the output piezoelectric layer is used as an input that is in communication with the system to be protected, and the electroded first surface of the input piezoelectric layer is used as an output. A signal from the system to be protected is converted to mechanical vibrational energy in the output piezoelectric layer; the mechanical vibrational energy is passed though the electrically conductive layer to the input piezoelectric layer; and the mechanical vibrational energy is converted back to an electrical signal at the first layer of the input piezoelectric layer. In this manner, a signal may be passed from a system to be protected disposed in the interior volume of the enclosure to a user outside the enclosure who is in communication with the electroded first surface of the input piezoelectric layer. Emanated emissions are prevented from leaving the enclosure because the electrically conductive layer may be in continuous peripheral contact with the electrically conductive enclosure forming a complete Faraday cage around the system to be protected, thereby not allowing such emanated emissions to escape the enclosure. Further, any conducted energy that is outside $BW_{SF}$ will not be conducted through the signal feedthrough, thus it will not be detectable outside the enclosure. In this use case, the signal feedthrough and enclosure of the invention prevent eavesdroppers outside the enclosure from being able to recover information content from emanated emissions or conducted energy from the system inside the enclosure because such emanated emissions or conducted energy are not allowed to leave the enclosed interior volume of the enclosure.

In embodiments, the signal feedthrough of the invention may comprise an input structure for receiving an input desired signal, an input piezoelectric layer for converting the received input desired signal to mechanical vibrational energy representing the input desired signal, a structure for communicating the mechanical vibrational energy through an electrically conductive layer to an output piezoelectric layer for receiving the mechanical energy and converting it to an output signal that is a replica of the received input desired signal. The transducers may be any electromechanical or electroactive device or material, including but not limited to electromechanical devices such as, by way of example and not limitation, solenoids or mechanical actuators, and piezoelectric devices or materials.

BRIEF DESCRIPTION OF THE DRAWINGS

The accompanying drawings, which are incorporated into and form a part of the specification, illustrate one or more embodiments of the present invention and, together with the description, serve to explain the principles of the invention. The drawings are only for the purpose of illustrating embodiments of the invention and are not to be construed as limiting the invention. In the figures, like item designators refer to like elements. The figures are not necessarily to scale, and elements in the figures are depicted without regard to their relative physical size or shape, so that the figures are not limiting as to the sizes of the depicted features in relation to one another.

In the drawings:

FIG. 7A depicts a system of the prior art that is susceptible to unwanted or undesired conducted and radiated emissions, in which unwanted or undesired conducted and radiated emissions are allowed into the enclosure by being conducted through wiring or radiated into the enclosure through a hole formed by a wire or other penetration.

FIG. 7B depicts a system of the invention that is protected from conducted and radiated emissions because the system to be protected is completely enclosed by a continuous electrically conductive surface having no holes or openings therethrough, but wherein power and data signals are able to be communicated to the system to be protected through the electrically conductive surface by a signal feedthrough of the invention.

DETAILED DESCRIPTION OF THE INVENTION

Figure 1A:
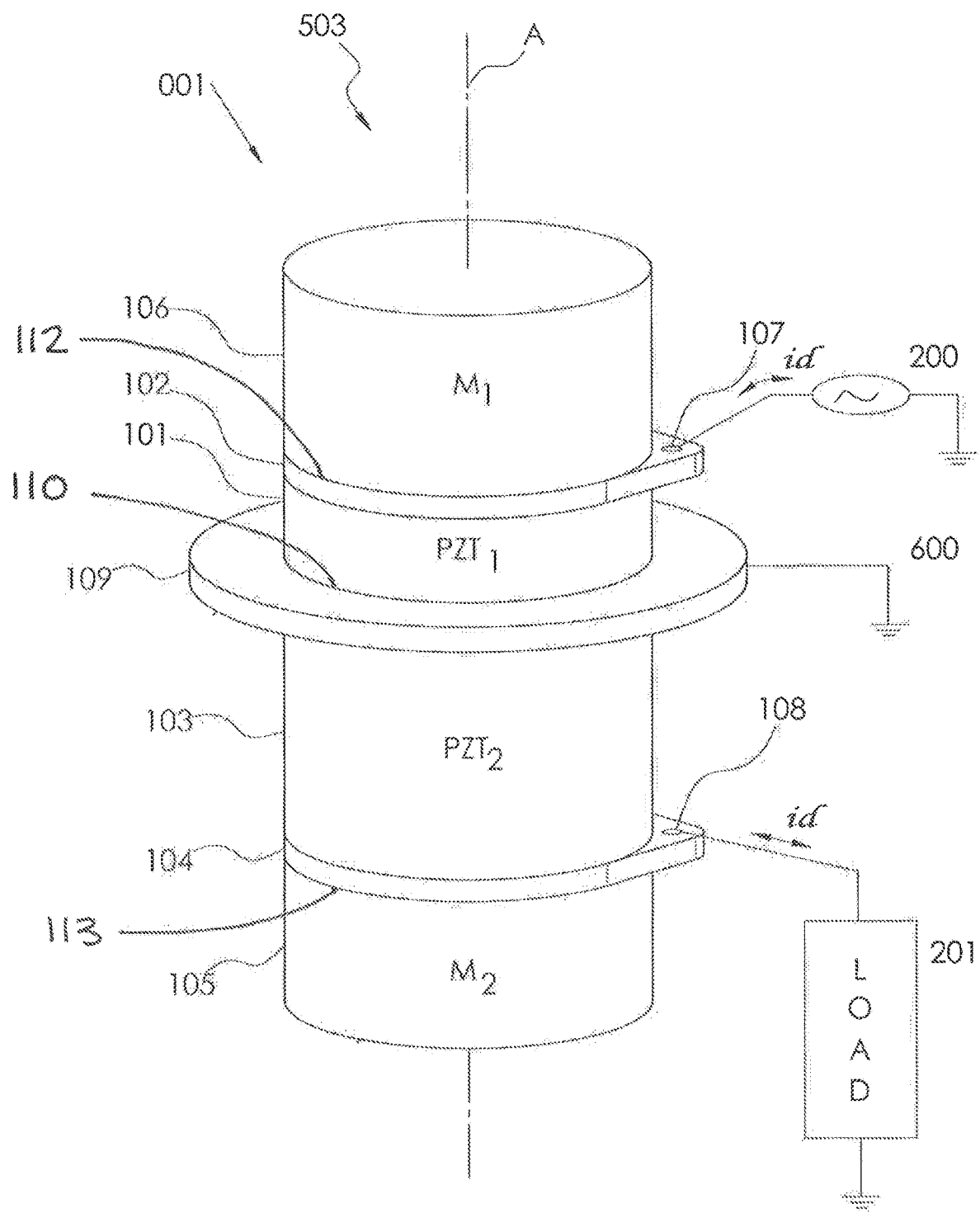
FIG. 1A depicts a perspective view of an embodiment of a non-electrically conductive feedthrough of the invention. In this exemplary embodiment, the feedthrough is circular in cross section but this is exemplary only as the feedthrough may be oval, square or rectangular in cross section, or may take any cross-sectional shape.

The following documentation provides a detailed description of the invention.

Although a detailed description as provided in the attachments contains many specifics for the purposes of illustration, anyone of ordinary skill in the art will appreciate that many variations and alterations to the following details are within the scope of the invention. Accordingly, the following preferred embodiments of the invention are set forth without any loss of generality to, and without imposing limitations upon, the claimed invention. Thus the scope of the invention should be determined by the appended claims and their legal equivalents, and not merely by the preferred examples or embodiments given.

As used herein, "piezoelectric material", or PZT, includes within its meaning any material that experiences a mechanical change when subjected to an applied electric charge, or which develops an electric charge when subjected to a mechanical stress or mechanical deformity, or both. A non-limiting, exemplary list of piezoelectric materials includes: ceramics including but not limited to barium titanate ($BaTiO_3$), lead zirconate titanate $Pb[Zr_xTi_x]O_3$, potassium niobate ($KNbO_3$), sodium tungstate ($Na_2WO_3$), $Ba_2NaNb_5O_5$, $Pb_2KNb_5O_{15}$, zinc oxide, sodium potassium niobate ($K_{0.5}Na_{0.5}NbO_3$), bismuth ferrite ($BiFeO_3$), sodium niobate ($NaNbO_3$), barium titanate ($BaTiO_3$ and $Bi_4Ti_3O_{12}$) and Sodium bismuth titanate $NaBi(TiO_3)_2$; crystalline materials such as langasite ($La_3Ga_5SiO_{14}$), gallium orthophosphate ($GaPO_4$), lithium niobate ($LiNbO_3$), lithium tantalate ($LiTaO_3$), quartz, berlinite ($AlPO_4$), rochelle salt, topaz, tourmaline-group minerals, and lead titanate (PbTiO$_3$); semiconductors such as, for example and not by way of limitation, III-V and II-VI semiconductors including zincblende and wurtzite crystal structures such as GaN, InN, AlN and ZnO, and any bulk or nanostructured semiconductor crystal having non-central symmetry; polymers, including amorphous and semi-crystalline polymers, including but not limited to polyvinylidene fluoride (PVDF) and its copolymers, polyamides, paralyne, polyimide polyvinylidene chloride (PVDC), voided charged polymers, polymer composites integrating piezoelectric ceramic particles into a polymer film; and any other material that experiences a mechanical change when subjected to an applied electric charge, or which develops an electric charge when subjected to a mechanical stress or mechanical deformity, or both. Such piezoelectric materials may, or may not be, polarized, in any direction.

As used herein, "electronics enclosure" or "housing" includes within its meaning any structure that has a substantially closed interior volume in which a system to be protected may be disposed, or housed. An electronics enclosure may comprise electrically conductive sheet materials that have been shaped to form the interior volume. The sheet materials may be a solid sheet material, or the sheet materials may comprise openings that are sized and disposed so as to significantly attenuate undesired radiated electromagnetic energy to which the enclosure may be subjected. Further, the sheet materials may comprise mu-metals. Electronics enclosures may have feedthroughs for allowing electrical power and communication signals to enter and exit the electronics enclosure, as well as other feedthroughs that may allow, for example, cooling air or liquids to enter or exit the enclosure.

As used herein, "undesired conducted energy" includes within its meaning electric currents that, when a system to be protected is subjected to such electric currents, experiences undesired results that render the system to be protected such that its operation is degraded or it is inoperable, temporarily or permanently. In some cases, the effect of the undesired conducted energy may be temporary such that the system returns to normal operation when the undesired radiated energy is removed. In other cases, the effect of the undesired conducted energy may be permanent such that the system does not return to normal operation when the undesired conducted energy is removed.

As used herein, "undesired radiated energy" includes within its meaning electric and/or magnetic fields that, when a system to be protected is subjected to such fields, experiences undesired results that render the system to be protected such that its operation is degraded or it is inoperable, temporarily or permanently. In some cases, the effect of the undesired radiated energy may be temporary such that the system returns to normal operation when the undesired radiated energy is removed. In other cases, the effect of the undesired radiated energy may be permanent such that the system does not return to normal operation when the undesired radiated energy is removed.

As used herein, "system to be protected" and "system" includes within their meaning any system, element, structure or device which may be susceptible to damage, degraded operation, or any undesirable effect resulting from being subjected to undesired radiated electromagnetic energy or conducted electrical energy. Such systems may comprise, by way of example and not by limitation, any electrical or electronic circuit; any system in communication with electrical conductors for transmission of electrical power or information; circuits comprising discrete logic components, analog electrical components, digital circuit components, semiconductor-based circuit elements including but not limited to microprocessors, memory devices, communication circuits, logic arrays, programmable logic, field programmable gates, and other digital circuit elements; electric power supplies; and any system comprising conductors or semiconductors. Such systems may include computers, radios, power supplies, guidance and control systems, motor controllers, and virtually any system comprising an electric or electronic circuit or device.

As used herein, "mu-metal" includes within its meaning any ferromagnetic alloy exhibiting a permeability greater than ordinary steel, for example greater than 10,000, and up to, and greater than, 100,000. An exemplary common range for the permeability of mu metal is 80,000 to 100,000. Exemplary, non-limiting compositions of mu-metal include approximately 77% nickel, 16% iron, 5% copper, and 2% chromium or molybdenum. Mu-metal may also be considered to be ASTM A753 Alloy 4 and may be composed of approximately 80% nickel, 5% molybdenum, small amounts of various other elements such as silicon, and the remaining 12% to 15% iron. A number of different proprietary formulations of the alloy are sold under trade names such as MuMETAL®, Mumetal1®, and Mumetal2®. Mu-metal may be a "soft" ferromagnetic material such that it has low magnetic anisotropy and magnetostriction, giving it a low coercivity so that it saturates at low magnetic fields. Other high-permeability nickel-iron alloys such as permalloy have similar magnetic properties; mu-metal's advantage is that it is more ductile, malleable and workable, allowing it to be easily formed into the thin sheets needed for magnetic shields such as electronics enclosures. Mu-metal objects, including electronics enclosures, may require heat treatment after they are in final form—annealing in a magnetic field in hydrogen atmosphere, which may increase the magnetic permeability of the mu-metal about 40 times. Such annealing alters the material's crystal structure, aligning the grains and removing some impurities, especially carbon, which obstruct the free motion of the magnetic domain boundaries. Bending or mechanical shock after annealing may disrupt the mu-metal's grain alignment, leading to a drop in the permeability of the affected areas, which can be restored by repeating the hydrogen annealing step.

As used herein, "Electromagnetic Pulse", or "EMP", includes within its meaning any transient electromagnetic disturbance or short burst of electromagnetic energy. Such a burst's origin may be a natural occurrence, or may be manmade, and may occur as a radiated, electric, or magnetic field or a conducted electric current, depending on the source and circumstance of the occurrence. An EMP may result in the generation of undesired conducted electric currents, undesired radiated electric fields and undesired magnetic fields.

As used herein, "electroded" means the creation of a conductive surface on an object through any means known in the art such as plating, depositing, sputtering or any form of metal deposition, or through any other means of creating, applying or attaching a conductive surface on an object or adjacent to an object. An electroded object has at least one surface that has received a conductive coating or is adjacent to and in electrical contact with a conductive surface.

As used herein, "signal" includes within its meaning desired energy provided from a source to a load. "Signal" includes within its meaning electrically conducted or mechanically transmitted energy that contains power or information. A non-limiting, exemplary list of signals includes: alternating electrical current (AC); non-time varying electrical voltages or currents (sometimes known as "discretes"); time varying electrical voltages or currents such as those used to transmit information; and mechanical stress or vibration, including time-varying stress and vibration.

As used herein, a "replica" of a signal means a resulting signal that has the same information content as an original, or input, signal. Thus, it may be, but is not necessarily, an exact replica of the input signal. The replica signal is not necessarily the same amplitude, polarity, level or spectral content of the input signal. Thus, as a non-limiting exemplary case, an output signal may be a replica of an input signal even if the output signal is level-shifted, scaled, or inverted or any combination of these; or even if it contains spectral components not present in the input signal, such as may be the case when the output signal has picked up noise as it is passed from input to output. A replica signal may be, for example, a scaled version of the replicated signal.

As used herein, "desired signal" includes within its meaning any signal that is intended for use by the system to be protected, or by any system in communication with the system to be protected. A desired signal may have a bandwidth $BW_d$ having a lower frequency $f_U$ and an upper $f_U$, within which the desired signal is contained.

As used herein, "mechanical transmission" of energy includes within its meaning any form of mechanical energy that is capable of transmitting a signal. The piezoelectric transmission of a signal from an input piezoelectric layer to an output piezoelectric layer as described herein is a non-limiting example of mechanical transmission of a signal.

As used herein, "electrically conductive enclosure" includes within its meaning any form or shape of enclosed volume, in which an enclosing structure forms an interior volume, and wherein the enclosing structure is electrically conductive. The enclosing structure may be a continuously electrically conductive sheet comprised of one or more conductive surfaces, such as when it is formed of a solid sheet of electrically conductive material; or it may comprise openings of a dimension small enough to prevent an undesired level of radiated electromagnetic energy to penetrate or radiate from or into the enclosed interior volume of the enclosure. The allowable dimension of any such opening may be determined by the susceptibility of the system to be protected to undesired radiated electromagnetic energy. Some systems, which may be highly susceptible to smaller levels of higher frequency radiated electromagnetic energy, may allow only small openings in the enclosing structure; other systems, which are less susceptible, may allow openings of larger dimensions in the enclosing structure. "Electrically conductive enclosure" also includes within its meaning electrically conductive enclosures in which the enclosing structure comprises mu-metal. The enclosing structure may comprise only electrically conductive materials, such an embodiment in which the enclosing structure is fabricated from a metal such as stainless steel, or it may comprise a combination of electrically non-conductive and electrically conductive materials such as an embodiment that comprises plastic or other non-conductive materials that have been plated or coated with a conductive surface. In such embodiments, the conductive surface may form a continuous conductive sheet surrounding the enclosed interior volume or may form a continuous conductive sheet comprising openings, as described above, that surrounds the enclosed interior volume. Such enclosures are known as EMI enclosures in the art. "Electrically conductive enclosure" includes within its meaning Faraday cages structures.

As used herein, "feedthrough" does not imply or mean that an opening or hole is created or required in the continuous electrically conductive surface or enclosure that forms the enclosed interior volume. "Feedthrough" includes within its meaning structures that receive a signal on a first end and either communicate that signal, or provide a replica signal, at a second end.

As used herein, "input side" includes within its meaning the side of a feedthrough that receives energy, such as electrical energy, from a source, and converts the received energy to mechanical vibrational energy for transmitting to the output side of the feedthrough.

As used herein, "output side" includes within its meaning the side of a feedthrough that receives energy, such as mechanical vibrational energy, from an input side of the feedthrough and converts the received energy to electrical energy for providing to a load.

It is well known that certain undesired radiated and conducted energy may have undesired effects on systems to be protected. In some cases in which the undesired radiated and conducted energy result in undesired voltages and currents in the system to be protected that are of a magnitude low enough that there is no permanent harm to the system to be protected, the undesired effect produced by the undesired radiated and conducted energy on the system may be limited to the generation of noise. Such noise may render the system to be temporarily non-operable, but the system may return to normal operation when the undesired radiated and conducted energy have ceased. However, in other cases, the undesired radiated and conducted energy may be of such magnitude that the system experiences voltages and or electric current exceeding breakdown levels such that the system suffers permanent damage in the form of burned out semiconductor junctions, semiconductor metal layers, cables, connectors, and the like. In such circumstances the result can be catastrophic, system-wide destruction of the ability to operate. In such circumstances, when the undesired radiated and conducted energy cease, the system may not return to normal operation.

In some circumstances, undesired radiated and conducted energy may be the result of natural phenomena such as lightning, electrostatic discharge (ESD), meteoric EMP, coronal mass ejection (i.e., a burst of plasma and accompanying magnetic field, ejected from the solar corona and released into the solar wind). In other circumstances, undesired radiated and conducted energy may be manmade such as, for example, the switching action of electrical circuitry, whether isolated or repetitive (as a pulse train); the closing and opening of electrical contacts in electric motors, clock and data signals in electronic systems, gasoline engine ignition systems, power line surges; EMP weapons including nuclear weapons, and continuously operated radiated emission weapons and jamming systems.

Figure 1B:
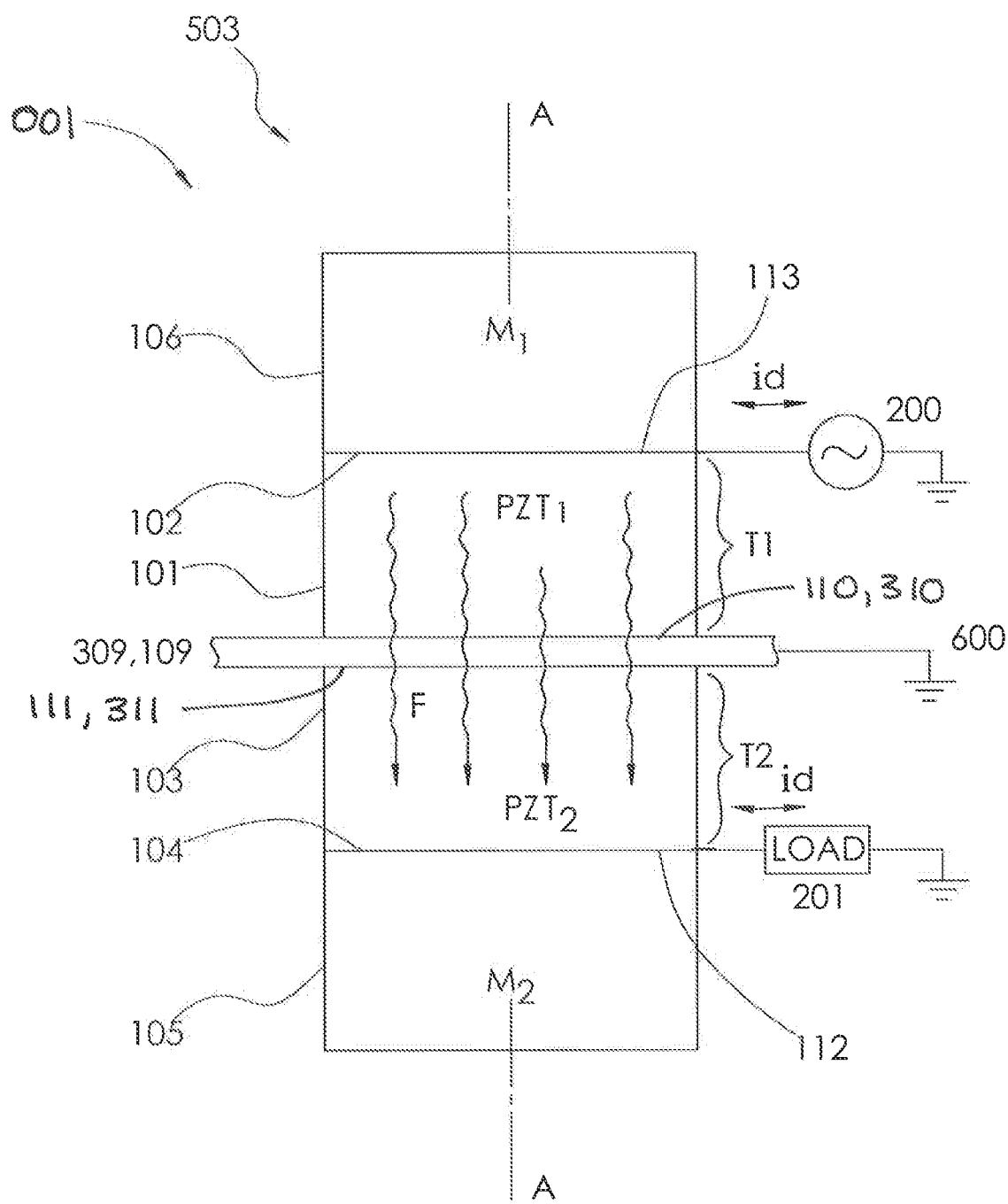
FIG. 1B depicts a schematic view of a non-electrically conductive feedthrough of the invention.
Figure 2:
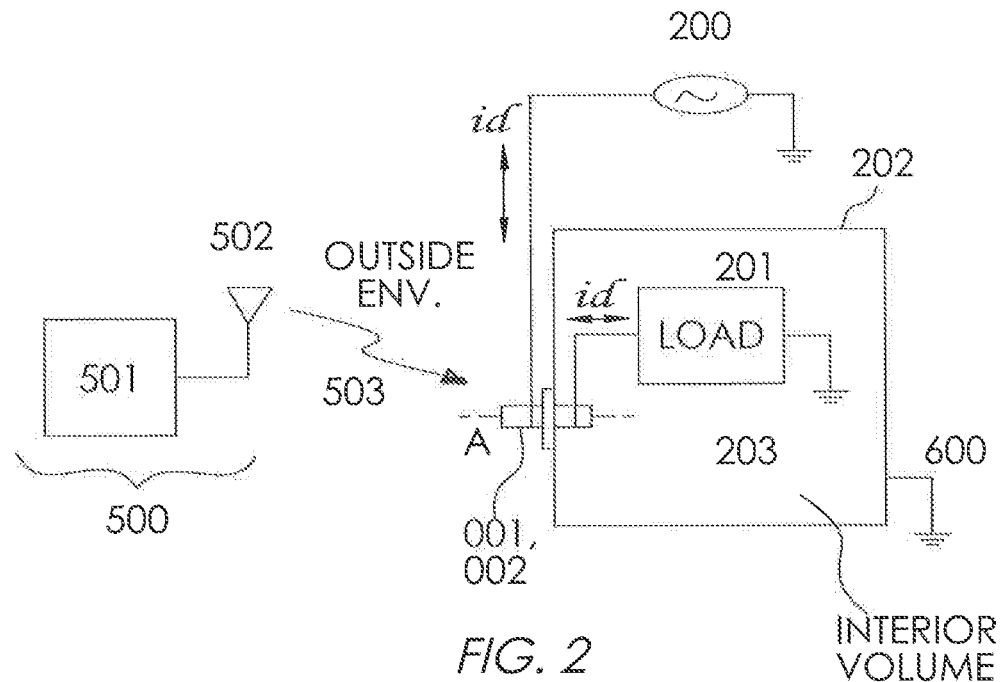
FIG. 2 depicts a schematic diagram of an embodiment of the inventive system comprising a non-electrically conductive feedthrough of the invention in conjunction with an electrically conductive electrical enclosure having an interior volume that encloses a system to be protected. Also depicted is an external source of undesired energy 501, radiating a level of energy 503 such that the electronic enclosure 202 is subjected to the undesired energy.

Referring now to FIGS. 1A and 1B, an exemplary embodiment of a signal feedthrough of the invention is depicted. The signal feedthrough 001 may comprise an input piezoelectric layer 101 having a first electroded surface 102 that may further comprise a terminal 107 for connecting conductor such that first electroded surface 102 is in electrical communication with a source 200 of a desired signal $i_d$, which may be a time-varying input electrical signal or energy. Terminal 107 may take any shape as may be suitable for a particular use or application, which shape may be dictated by physical constraints of the use. Source 200 may be electrically connected to first electroded surface 102 by any means known in the electrical arts. Input piezoelectric layer 101 may have a second surface 110 adjacent to, and in physical contact with, a surface of an electrically conductive layer 109. As is depicted further in FIG. 5, electrically conductive layer 109 may be utilized as a flange for attaching signal feedthrough 001 to a wall or other surface of an electrically conductive enclosure such as enclosure 202 depicted in FIGS. 2, 3 and 5. The first electroded surface 102 and second surface 110 of input piezoelectric layer 101 may be opposing surfaces each surface being normal to axis A, and they may define a first thickness T1 of input piezoelectric layer 101. In an embodiment, input piezoelectric layer 101 may be polarized in a direction parallel to axis A. When used to communicate a desired signal $i_d$ to a system to be protected 201 as depicted in FIG. 2, input piezoelectric layer 101, first electroded surface 102 and optional rigid end-mass 106, described below, define a signal input section or an input side of the feedthrough.

Still referring to FIGS. 1A and 1B, electrically conductive layer 109 may form a complete, electrically uninterrupted sheet spanning an completely covering the entire cross section of feedthrough 001 (or 002), such that when feedthrough 001 is attached an enclosure, such as enclosure 202, as depicted in FIGS. 7A and 7B, in which a continuous, uninterrupted electrical connection between the periphery of electrically conductive layer 109 and an electrically conductive external surface of the electrically conductive enclosing exterior surfaces of enclosure 202, a completely uninterrupted electrically conductive three dimensional shape of enclosure 202 is established, having an interior volume, that does not allow undesired radiated energy 503 to be radiated into the interior volume. In other words, in embodiments, the resulting structure may form a Faraday cage enclosing the system to be protected. The continuous, uninterrupted electrical connection between the periphery of electrically conductive layer 109 and an electrically conductive external surface of the electrically conductive enclosing exterior surfaces of enclosure 202 may be established by any means in the electro-mechanical arts for making electrical connection between two electrical conductors, including but not limited to welding, brazing, soldering, electrical conductive chemical bonding, and so on.

Still referring to FIGS. 1A and 1B, signal feedthrough 001 may comprise an output piezoelectric layer 103 having a third surface 111 adjacent to, and in physical contact with, a surface of electrically conductive layer 109. Output piezoelectric layer 103 may further comprise a fourth electroded surface 104 that may further comprise a terminal 108 for connecting a conductor such that fourth electroded surface 104 is in electrical communication with a load 201, providing desired signal $i_d$ to load 201, which may be a system to be protected. Terminal 108 may take any shape as may be suitable for a particular use or application, which shape may be dictated by physical constraints of the use. Load 201 may be electrically connected to fourth electroded surface 104 by any means known in the electrical arts. The fourth electroded surface 104 and third surface 111 of output piezoelectric layer 103 may be opposing surfaces, each surface being normal to axis A, and they may define a first thickness T2 of output piezoelectric layer 103. In an embodiment, input piezoelectric layer 101 may be polarized in a direction parallel to axis A. When used to communicate a desired signal $i_d$ to a system to be protected 201 as depicted in FIG. 2, output piezoelectric layer 103, fourth electroded surface 104 and optional rigid end-mass 105, described below, define a signal output section, or output side of the feedthrough. The mechanical vibration generated by input piezoelectric layer 101 in response to its excitation by the input desired signal $i_d$ is depicted by arrows F. The mechanical vibration F is received by output piezoelectric layer 103, causing a replica of the input desired signal $i_d$ to appear on the electroded fourth layer of output piezoelectric layer 103.

Still referring to FIGS. 1A and 1B, axis A may be an axis of input piezoelectric layer 101. Axis A may be an axis of output piezoelectric layer 103. Axis A may also be an axis of signal feedthrough 001.

Still referring to FIGS. 1A and 1B, in embodiments, an optional end-mass 106 ($M_1$) may be disposed adjacent to and attached to the first surface of the input piezoelectric layer 101 ($PZT_1$). Likewise, an optional end-mass 105 ($M_2$) may be disposed adjacent to and attached to the fourth surface of the output piezoelectric layer 103 ($PZT_2$). These optional end-masses may operate to alter the resonant frequency of the signal feedthrough to match the frequency characteristics of a desired signal in order to maximize the operation of the signal feedthrough in communicating the desired signal through the feedthrough. Each optional end-mass may be rigid, and may comprise metal. The end-masses may be bonded to the adjacent surfaces 102 or 104. The bonding of such optional end-masses to either, or both, ends of the signal feedthrough may be viewed as adding additional mass to the ends of the signal feedthrough or as replacing some of the ceramic in an output portion of the signal feedthrough. Adding an end-mass to the output portion of the signal feedthrough increases the total mass and volume of the signal feedthrough. An end-mass may be used to replace a portion of output ceramic and depending on the density of the end mass that replaces the ceramic, the total volume of the signal feedthrough can remain the same while the mass decreases (with a less dense end-mass) or increases (with a denser end mass). Alternatively, an end-mass may be used to replace a portion of output ceramic and the total mass of the signal feedthrough may remain the same while the volume or length of the signal feedthrough increases (with a less dense end-mass) or decreases (with a denser end-mass). These examples are illustrative of the effect of including optional end-masses of differing density to the signal feedthrough. In an embodiment of the signal feedthrough, a dense end mass may be added to the output portion of the signal feedthrough, increasing both the mass and volume of the signal feedthrough. An increase in the mass of the signal feedthrough, or an increase in length, operates to lower the resonant frequency of the signal feedthrough while increasing the gain and power density of the signal feedthrough. The increase in gain is due to the fact that the added end-mass increases the momentum of the device without adding any ceramic layers (which add to the capacitance and dielectric losses). The increase in gain without adding ceramic layers results in a higher power density (ratio of power to volume ceramic). The end-masses 105 and 106 may be chemically or otherwise bonded to their adjacent piezoelectric layer surface at bond line 112 or 113. Furthermore, the length of the end-mass(es) may be selected to ensure that during operation of the signal feedthrough, maximum compressive and tensile forces are concentrated at the bond line 112 and 113 between the end-mass and adjacent piezoelectric layer, resulting in increased gain. Further, since the end-masses have a high mechanical quality factor Q, the gain and power density increase commensurately with the increase in mechanical quality factor of the composite signal feedthrough. Furthermore, the cost of the signal feedthrough is reduced due to the availability of inexpensive metal material to replace the more expensive piezoelectric material, and the ease of bonding metal end-masses to piezoelectric layers as opposed to the expense of conventional laminated multilayer piezoelectric manufacturing techniques. Thus, the use of one or more optional end-mass(es) may be utilized to tune a natural frequency of a signal feedthrough to fall within the bandwidth of a desired signal $BW_d$ as discussed below in relation to FIG. 6. The thickness of an end-mass may be chosen dependent on the type of material used for the end-mass and the resonant characteristics desired from the composite signal feedthrough. In embodiments in which the piezoelectric material is ceramic, a preferred end-mass and material may be steel, because it is denser than ceramic piezoelectric material and the profile of a signal feedthrough may be minimized using a denser end-mass. Regardless of the material used for the end-mass, in embodiments it may be non-electroactive and have a mechanical quality factor (Q) greater than that of the electroactive layers of the signal feedthrough.

In embodiments, the piezoelectric layers 101 and 103, and the optional end masses 105 and 106, may be of similar exterior shape. In embodiments, the piezoelectric layers 101 and 103, and optional end masses 105 and 106, may be coaxially located.

Referring now to FIG. 2, a system diagram depicting a threat source of energy 501, coupled into an antenna or other transducer 502, such that undesired radiated energy 503 is radiated. Threat source of energy 501 and antenna or other transducer 502 form a threat system 500, which may be any manmade or naturally occurring source of undesired radiated energy. If the system to be protected 201 were not protected by disposing it within an interior volume 203 of electrically conductive enclosure 202 and signal feedthrough of the invention 001, it would be subjected to the interruptive and potentially disruptive effect of undesired radiated energy 503, causing interruption in operation and possibly destruction of sensitive circuits and devices comprising the system to be protected 201. Shown for reference is a source 200 of a desired signal $i_d$.

Figure 3:
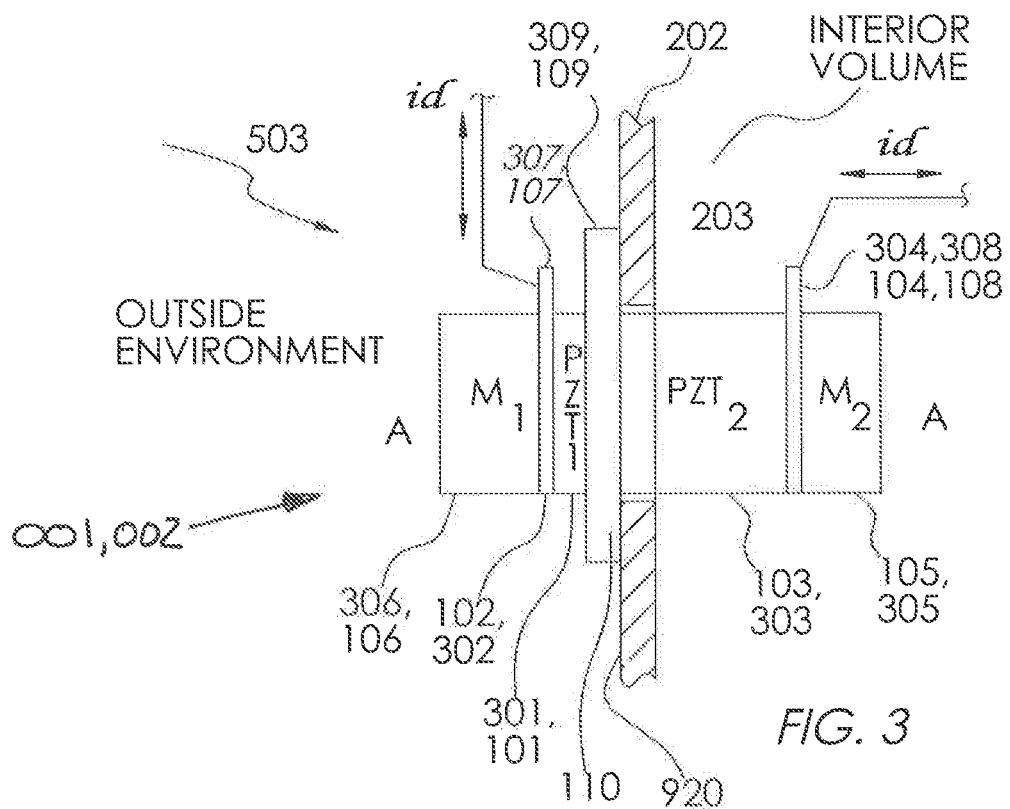
FIG. 3 depicts a cutaway view of an embodiment of a non-electrically conductive feedthrough of the invention attached to an electrically conductive electrical enclosure having an interior volume that encloses a system to be protected. In embodiments, optional EMI mesh used to provide circumferentially complete electrical conductivity between the mounting flange of the feedthrough to an outer surface of the electrically conductive electrical enclosure 202.
Figure 5:
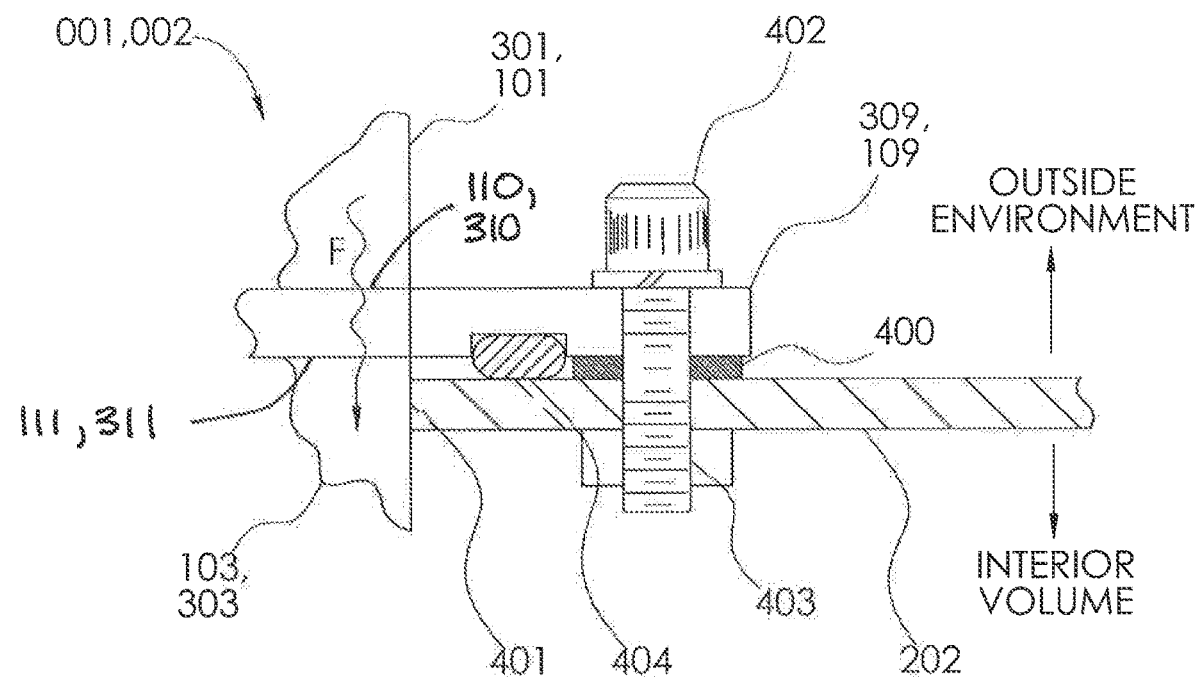
FIG. 5 depicts a broken-out expanded cross section view of an embodiment of a non-electrically conductive feedthrough of the invention that, among other things, is applicable to retrofit applications.

Referring now to FIGS. 3 and 5, cross sectional views of a signal feedthrough 001, 002 attached to an electrically conductive enclosure 202 is depicted. In order to isolate the signal feedthrough 001, 002 of the invention from undesired shock and vibration, a compressible, shock and vibration isolating material 400, such as, for example, rubber, may be disposed between electrically conductive layer 109, 309 and a wall of the electrically conductive enclosure 202. Isolation of the signal feedthrough 001, 002 from such shock and vibration prevents such shock and vibration from producing unwanted charges in the output piezoelectric layer 103, 303 of the signal feedthrough, which, if within bandwidth $BW_{SF}$, may manifest as electrical noise in reproduced desired signal is as generated in the output piezoelectric layer. A groove in electrically conductive layer 109, 309 may contain an electrically conductive EMI mesh or other electrically conductive material 404, which may be compressible, providing continuous electrical contact between electrically conductive layer 109, 309 and electrically conductive enclosure 202, forming continuous electrical contact around the periphery of the attachment of electrically conductive layer 109, 309 to a wall of electrically conductive enclosure 202, providing a completely continuously electrically conductive three dimensional enclosure having an interior volume for housing, or containing, a system to be protected 201. Piezoelectric layer 103 or 303 may protrude into the interior volume of enclosure 202 through opening 401 in an exterior wall of enclosure 202, without causing an opening in the continuously electrically conductive three dimension enclosure formed by electrically conductive layer 109 (or 309), conductive material 404 and conductive wall of enclosure 202. Optional end-masses 106, 306, 105 and 305 are shown for reference. Also input piezoelectric layer 101, 301 and electroded first surface 102, 302 are shown for reference. Electrically conductive layer 109, 309 may be attached to an outer surface of electrically conductive enclosure 202 by any means such as threaded fastener 402 engaged with receiving female matching threads 403, or by welding or chemical bonding, which may be conductive. Terminals 107, 307, 108, 308, and electroded surfaces 102, 302, 104, 304 are depicted for reference.

Figure 4:
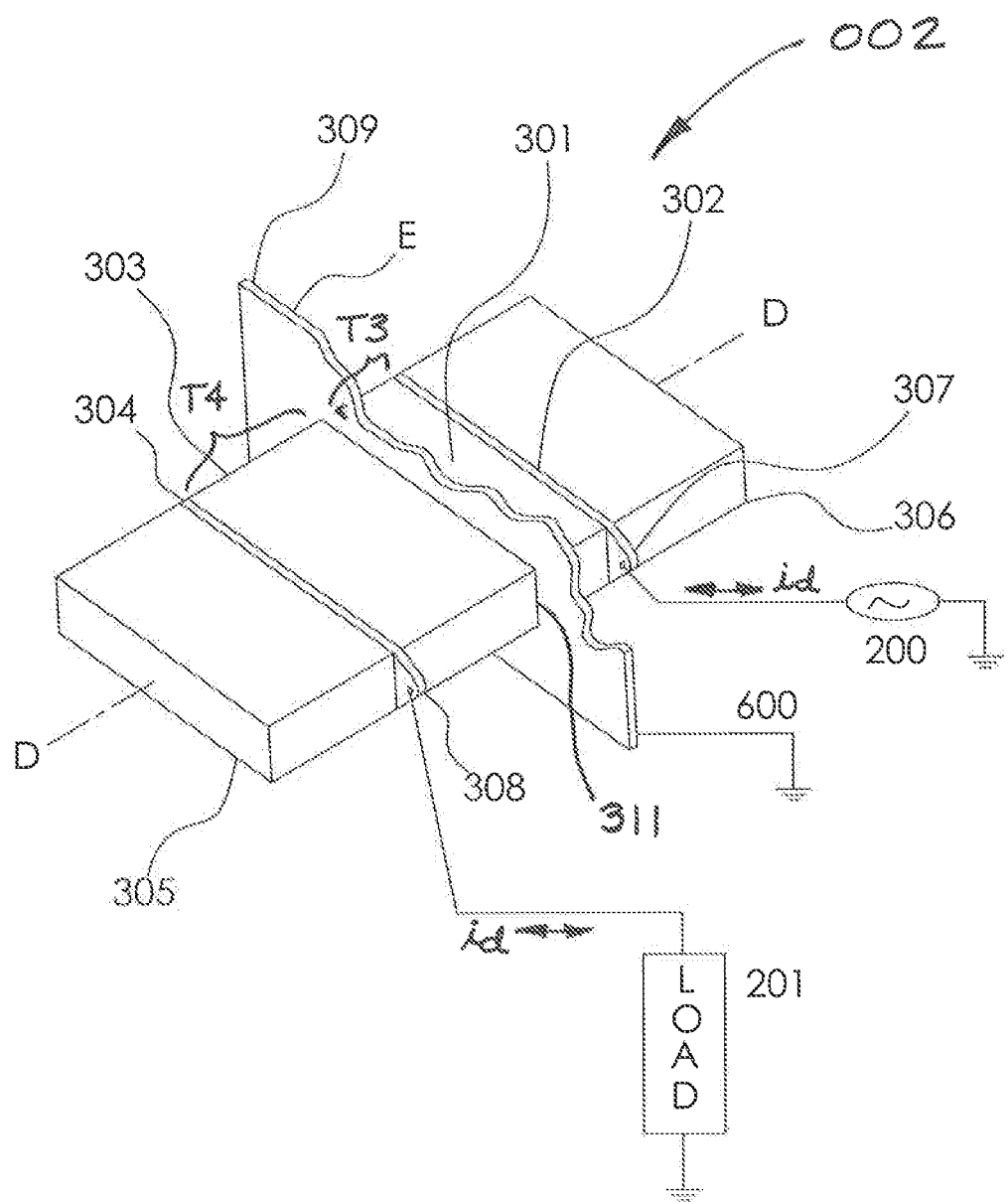
FIG. 4 depicts a perspective view of an embodiment of a non-electrically conductive feedthrough of the invention that is rectangular in cross section, feedthroughs of the invention may take any desired cross-sectional shape.

Referring now to FIG. 4, another exemplary embodiment of a signal feedthrough of the invention 002 is depicted. The signal feedthrough 002 may comprise an input piezoelectric layer 301 having a first electroded surface 302 that may further comprise a terminal 307 for connecting a conductor such that first electroded surface 302 is in electrical communication with a source 200 of a desired signal $i_d$. Terminal 307 may take any shape as may be suitable for a particular use or application, which shape may be dictated by physical constraints of the use. Source 200 may be electrically connected to first electroded surface 302 by any means known in the electro-mechanical arts. Input piezoelectric layer 301 may have a second surface 310 (not called out in FIG. 4, but second surface 310 is called out in FIG. 5, and, as can be seen in FIG. 5, is analogous to second surface 110 as depicted in FIGS. 1A and 1B) adjacent to, and in physical contact with, a surface of an electrically conductive layer 309. As is depicted further in FIG. 5, electrically conductive layer 309 may be utilized as a flange for attaching signal feed-through 002 to a wall or other surface of an electrically conductive enclosure such as enclosure 202 as depicted in FIGS. 2, 3 and 5. The first electroded surface 302 and second surface 310 of input piezoelectric layer 301 may be opposing surfaces each surface being normal to axis D, and they may define a first thickness T3 of input piezoelectric layer 301. In embodiments, input piezoelectric layer 301 may be polarized in a direction parallel to axis D. When used to communicate a desired signal $i_d$ to a system to be protected 201 as depicted in FIG. 2, input piezoelectric layer 301, first electroded surface 302 and optional rigid end-mass 306, described below, define a signal input section.

Still referring to FIG. 4, signal feedthrough 002 may comprise an output piezoelectric layer 303 having a third surface 311 adjacent to, and in physical contact with, a surface of electrically conductive layer 309. Output piezoelectric layer 303 may further comprise a fourth electroded surface 304 that may further comprise a terminal 308 for connecting a conductor such that fourth electroded surface 304 is in electrical communication with a load 201, providing desired signal $i_d$ to load 201, which may be a system to be protected. Terminal 308 may take any shape as may be suitable for a particular use or application, which shape may be dictated by physical constraints of the use. Load 201 may be electrically connected to fourth electroded surface 304 by any means known in the electrical arts. The fourth electroded surface 304 and third surface 311 of output piezoelectric layer 303 may be opposing surfaces, each surface being normal to axis D, and they may define a first thickness T4 of output piezoelectric layer 303. In embodiments, output piezoelectric layer 303 may be polarized in a direction parallel to axis D. When used to communicate a desired signal $i_d$ to a system to be protected 201 as depicted in FIG. 2, output piezoelectric layer 303, fourth electroded surface 304 and optional rigid end-mass 305, described below, define a signal output section.

Still referring to FIG. 4, axis D may be an axis of input piezoelectric layer 301. Axis D may be an axis of output piezoelectric layer 303. Axis D may also be an axis of signal feedthrough 002.

In embodiments, the piezoelectric layers 301 and 303, and the optional end masses 305 and 306, may be of similar exterior shape. In embodiments, the piezoelectric layers 301 and 303, and optional end masses 305 and 306, may be coaxially located.

As with other embodiments of the invention, in the embodiment depicted in FIG. 4, the direction of signal flow $i_d$ may be reversed. In other words, a signal may flow from, i.e. be generated by, load 201, whereupon it vibrationally energizes output piezoelectric layer 303, which vibration is transmitted to input piezoelectric layer 301, the resulting vibration in piezoelectric layer 301 generating an electric signal $i_d$ at terminal 307 that is a replica, which may be a scaled replica, of the signal $i_d$ generated by load 201. In other words, the signal feedthrough may be bidirectional and may flow through the feedthrough in either direction.

Figure 6:
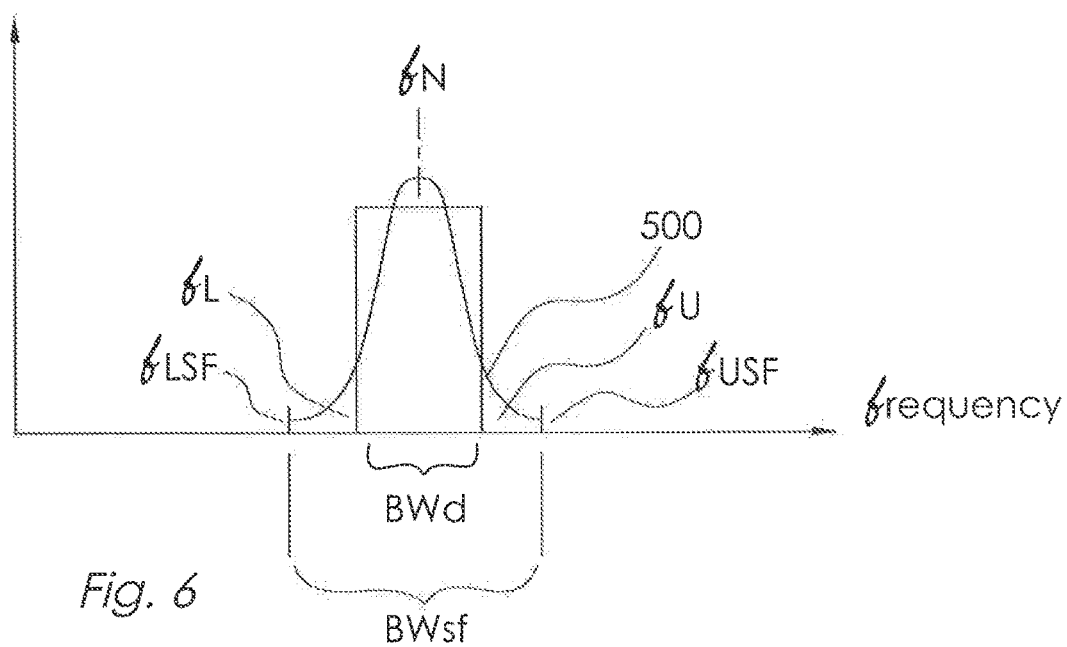
FIG. 6 depicts a bandwidth of a desired signal $BW_d$ having a lower frequency $f_L$ and an upper $f_U$, within which the desired signal is contained. Overlaid on the plot of desired signal bandwidth is a depiction of a frequency response of an exemplary signal feedthrough of the invention.

Referring now to FIG. 6, a bandwidth of a desired signal $BW_d$ is depicted. A desired signal may have a lower frequency $f_L$, and an upper frequency limit $f_U$ defining desired signal $BW_d$ within which the desired signal is contained. By selecting the materials, mass and length of the electroactive layers and optional end-masses, a signal feedthrough of natural frequency $f_N$ and bandwidth $BW_{SF}$ with a lower cutoff frequency $f_{LSF}$ and an upper frequency $f_{USF}$ may be constructed. Natural frequency $f_N$ is preferably selected to fall within $BW_d$, and $BW_{SF}$ may be selected to encompass $BW_d$. Energy that is above $f_{USF}$ or below $f_{LSF}$ is not converted to mechanical vibrational energy by the input electroactive layer. Thus, not only does the signal feedthrough not provide any electrically conductive path from the input electroactive layer to the output electroactive layer, but the signal feedthrough also rejects energy falling outside $BW_{SF}$ that is coupled into any conductors in communication with the input electroactive layer.

Referring now to FIG. 7A, a system of the prior art that is susceptible to unwanted or undesired conducted and/or radiated emissions is depicted, in which unwanted or undesired conducted 700, 701 and radiated 702 emissions are allowed into the interior volume of the enclosure 202 by being conducted through wiring or filtering or radiated into enclosure 202 through a hole formed by a wire or other penetration, allowing a voltage or current spike 701 to form on electrical conductors of electrical devices placed in the interior volume of the enclosure 202.

FIG. 7B depicts an embodiment of system of the invention that is protected from conducted and radiated emissions because the system to be protected is completely enclosed by a continuous electrically conductive surface having no holes or openings therethrough, but wherein power and data signals are able to be communicated to the system to be protected through the electrically conductive surface of enclosure 202 by a signal feedthrough of the invention. No undesired conducted 700, 701 and radiated 702 emissions are allowed into the interior volume of the enclosure 202, because 1) there is no electrically conductive path through the feedthrough of the system; and 2) there are no openings or gaps in the continuous electrically conductive sheet surfaces that completely enclose electrical devices placed in the interior volume of the enclosure 202.

Figure 8A:
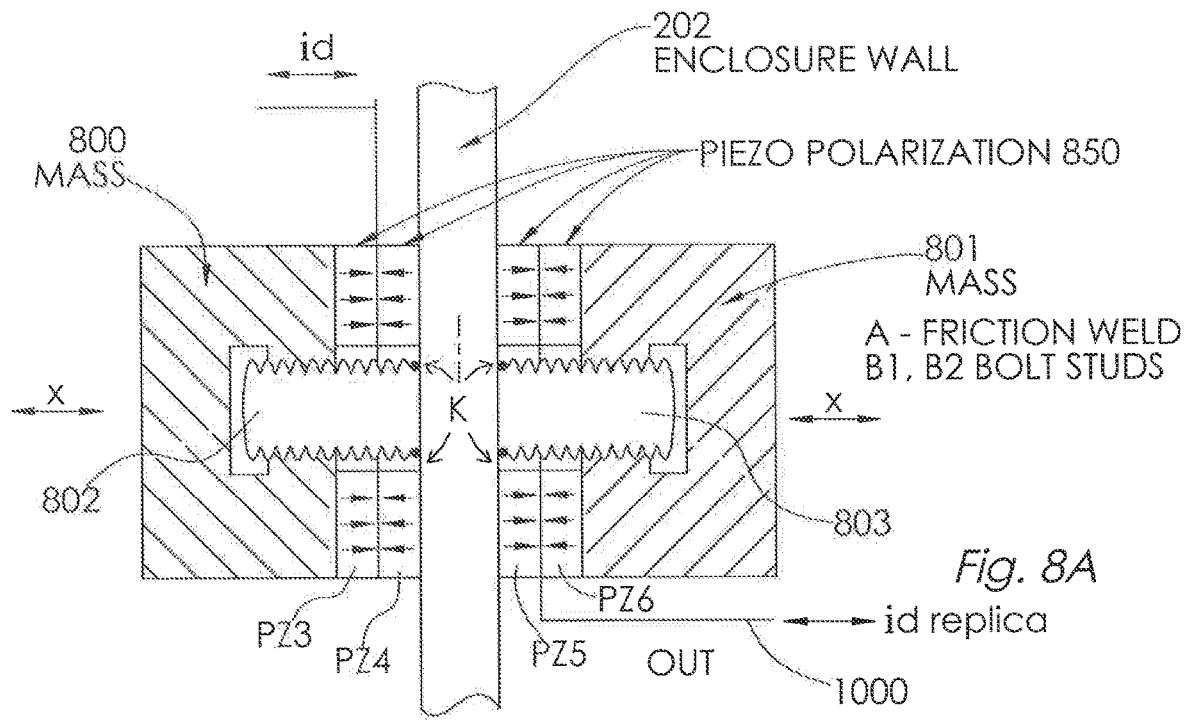
FIG. 8A depicts an embodiment of a non-electrically conductive signal feedthrough of the invention in which two male threaded studs may be bonded, welded, friction welded or otherwise attached to a continuous electrically conductive enclosure, and wherein the masses comprise matching female threads. The piezoelectric layers are captured and may be placed in compression between a mass and a surface of the enclosure as the masses are threadingly engaged on a threaded stud and tightened down against the piezoelectric layer.
Figure 8B:
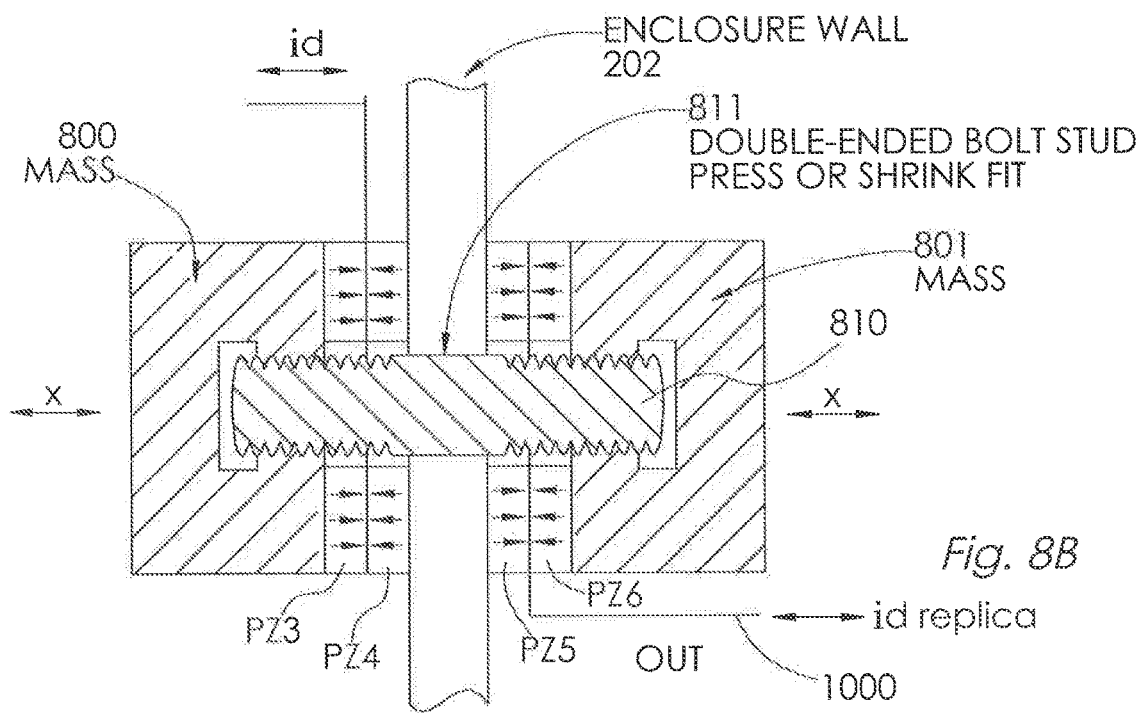
FIG. 8B depicts an embodiment of a signal feedthrough of the invention similar in operation to that of FIG. 8A, but wherein the threaded studs are formed of a unitary structure comprising male threaded portions on either end, with a shoulder portion between them that is press fit or shrink fit into an opening in the enclosure. The cylindrical structure may comprise conductive material such that, when press fitted or shrink fitted into the receiving opening, a continuous electrically conductive enclosure 202 is formed. I.e. there is no resulting opening or hole in the continuous electrically conductive surface or enclosure. Thus the system to be protected is completely enclosed by a continuous electrically conductive surface.

Referring now to FIGS. 8A and 8B, an embodiment of a non-electrically conductive signal feedthrough of the invention in which two male threaded studs 802 and 803 may be bonded, welded, friction welded or otherwise attached to a continuous electrically conductive enclosure 202, and wherein mass 800 and mass 801 each comprise matching female threads. The piezoelectric layers PZ3 and PZ4 may be disposed in compression between mass 800 and a surface of enclosure 202 and piezoelectric layers PZ5 and PZ6 may be disposed in compression between mass 801 and a surface of the enclosure. Each mass 800 and 801 may therefore be threadingly engaged on a threaded stud 802 or 803, respectively and tightened down against the piezoelectric layers PZ3 and PZ4, which may be oppositely polarized as depicted by the arrows in the figure. A time varying signal $i_d$ applied to the piezoelectric layers PZ3 and PZ4 drives mass 800 back and forth in the direction x because the piezoelectric layers are tightened against the surfaces of enclosure 202, mechanical energy, i.e. vibrational energy, is translated from piezoelectric layers PZ3 and PZ4 through enclosure 202 wall and into piezoelectric layers PZ5 and PZ6 on the other side of enclosure wall 202. Masses 800 and 801 may amplify the vibrational energy, which is proportional to the time-varying input signal $i_d$. The transferred vibrational energy operates on piezoelectric layers PZ5 and PZ6, which may be oppositely polarized as depicted by the arrows in each, to produce a time-varying signal in conductor 1000 that is proportional to input time-varying signal $i_d$. As depicted in FIG. 8A, the studs may be welded, such as friction welded, onto a surface of enclosure 202. Alternatively, they may be chemically bonded onto a surface of enclosure 202. Still further, referring to FIG. 8B, the threaded studs 810 may be a part of a unitary structure 811 that passes through an opening in enclosure 202, completely filling the opening and being press fit or shrink-fitted into places. In any event, the non electrically conductive feedthrough of the invention operates to communicate a replica of a time-varying input signal through an enclosure wall that forms part of a continuous electrically conductive sheet that completely encloses an interior volume, without any holes, gaps or openings in the continuous electrically conductive sheet. Furthermore, there is no electrically conductive path through the feedthrough or through the enclosure wall. Therefore, no undesired radiated or conducted emissions may enter or leave the interior volume of enclosure 202.

Figure 9:
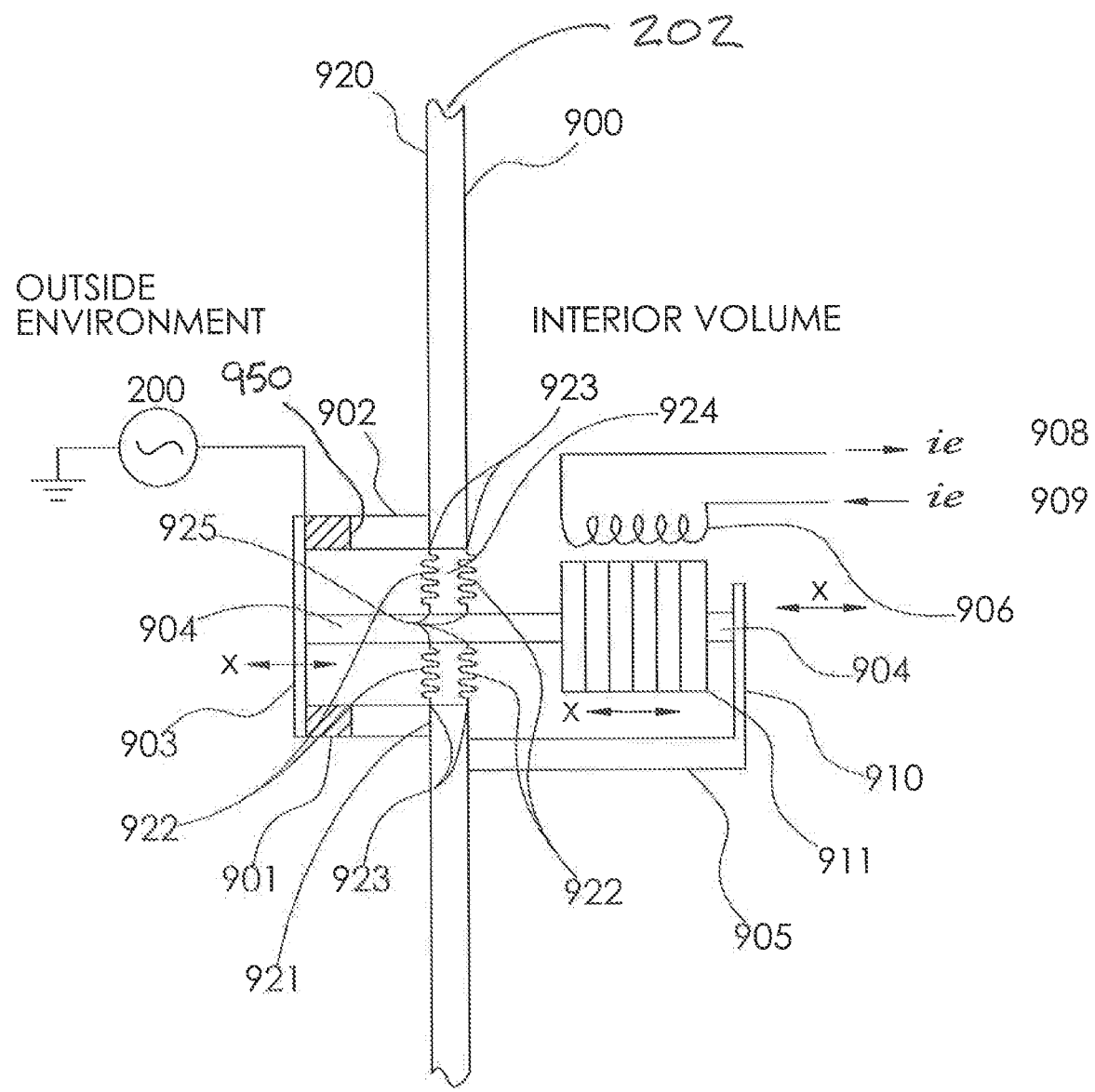
FIG. 9 depicts an embodiment of a signal feedthrough of the invention that utilizes a piezoelectric ring or other structure to convert a time-varying electrical signal into a mechanical translation of a magnet or magnet array that is in magnetic communication with an electrical coil. When a time varying signal is applied to the electric ring or other structure, the rod is translated along an axis proportionally to the time varying signal, inducing a time-varying electrical current in the coils, and thus producing a time-varying electrical voltage or current appearing at the coil leads, the time-varying signal being proportional to the time-varying signal that was applied to the piezoelectric ring or other structure. There is no electrically conductive path from outside the enclosure to the coil, and the electrical enclosure completely encloses the interior volume of the enclosure with an uninterrupted completely continuous three dimensional electrically conductive sheet that has no electrical openings.

Referring now to FIG. 9, an embodiment of a feedthrough of the invention is depicted in which the invention comprises a support ring 902 having a first surface 921 that may be attached to an outside facing, or exterior facing, surface 920 of an enclosure 202. The support ring 902 may in turn comprise a second surface 950 that is attached to or otherwise in mechanical communication with a surface of a piezoelectric ring 901. The piezoelectric ring 901 may be attached by any known means such as, for example, chemical bonding, to a drive disk 903, which may comprise a flexible material, to which is also attached to a first end of rod 904. Rod 904 may extend through piezoelectric ring 901, passing through at least one, or a plurality of, flexible membranes 922. Flexible membranes 922 may be attached to and may be in continuous electrical communication with and all along the peripheral edges of an opening 924 in the wall of enclosure 202 where the outer edge(s) of the flexible membrane(s) 922 comes into contact with the edge formed by opening 924 in the wall of enclosure 202 along 923. Flexible membranes 922 may be in electrical communication with the peripheral edges of opening 924 in the wall of enclosure 202 along the entire periphery of the opening 924 and may be attached continuously along the periphery of the opening 924 in the wall of enclosure 202 using electrically conductive attachment means such as, for example, welding or electrically conductive chemical bonding, forming a complete and continuous electrical connection between the outer edge of flexible membranes 922 and the inner edge of opening 924 in enclosure 202 where the outer edge of flexible membranes 922 comes into contact with the edge formed by opening 924 in enclosure 202 at 923. Rod 904 may pass through openings 925 in flexible membrane(s) 922. The invention may comprise one or more flexible membranes 922. In the embodiment depicted in FIG. 9, two flexible membranes are depicted. Rod 904 may be attached, for example by welding or conductive chemical bonding or other electrically conductive means, to openings 925 in flexible membranes 922 all along the entire circumference of opening 925, forming a complete and continuous electrical connection around rod 904, the electrical connection being between rod 904 and the edge of opening 925 in flexible membranes 922 where it passes through openings 925 and comes into physical and electrical contact with the edges of openings 925 in flexible membranes 922. Flexible membranes 922, rod 904, and drive disk 903 may each comprise electrically conductive material such as, for example, a metal or metal-coated plastic or other substrate material. Thus the opening(s) 925 in flexible membrane(s) 922 and the opening 924 in enclosure 202 are electrically sealed and form a continuous electrically conductive surface that surrounds the interior volume of enclosure. In other words, rod 904 is able to pass into the interior volume of enclosure 202 without creating any voids or openings in enclosure 202 that would allow electromagnetic energy to radiate into, or out of, the interior volume of enclosure 202.

Still referring to FIG. 9, a signal source 200 producing a time-varying electrical signal is in electrical communication with piezoelectric ring 901. The time-varying electrical signal is communicated to piezoelectric ring 901, which induces mechanical energy in the direction of X in piezoelectric ring 901, back and forth. Because drive disk 903 is attached to a first end of rod 904, rod 904 is caused to translate back and forth along the direction of x in proportion to the time varying signal. Drive disk 903 may be, but is not necessarily, flexible. A second end of rod 904 may be attached to a flexible structure 910 that allows rod 904 to translate back and forth along x as driven by piezoelectric ring 901, proportional to the time varying signal. Magnet array 911 may be disposed on rod 904, and is thus also translated back and forth along x proportional to the time varying signal. Magnet array 911 may be fixedly attached to rod 904 by any means such as chemical bonding or may be attached to rod 904 via any means that allows magnet array 911 to translate back and forth, such as in a spring loaded fashion, so as to apply one or more natural frequencies or other frequency responses in order to achieve a desired effect. Magnet array 911 may comprise one or more magnets, for example a plurality of magnets which may be permanent magnets or any other form of magnet, and may be in magnetic communication with electrical coil 906 so as to produce a time-varying current or voltage differential in conductors 908 and 909 which are in electrical communication with coil 906 when magnet array is driven back and forth in the direction of X by rod 904. I.e. conductors 908 and 909 may form first and second electrical leads for coil 906, and current $i_e$ may flow into a load that is connected to leads 908 and 909 when a time-varying signal is applied by source 200, which may be any source of time-varying electrical energy, including an electrical power source for powering electrical loads or devices that are disposed in the interior volume of enclosure 202, or any source of electrical signal. Source 200 may also be any communication, frequency or other electrical source that provides a time-varying electrical signal to any electrical loads or devices that are disposed in the interior volume of enclosure 202. Since the openings that allow rod 904 to enter into interior volume of enclosure 202 form a continuous, uninterrupted electrically conductive enclosure completing surrounding and enclosing enclosure 202, no radiated emissions are allowed to enter or leave enclosure 202. Likewise, since the electrical wiring from source 200 is only in communication with piezoelectric ring 901, and because there is no electrically conductive path from source 200 to coil 906, no electrically conducted emissions from outside enclosure 202 can be placed on the electrical leads 908 and 909 which in communication with the electrical load(s) or sources in the interior volume of enclosure 202. Thus, desired time varying electrical energy and signals may be communicated to loads, circuits and devices located within the interior volume of enclosure 202, but unwanted radiated and conducted emissions may not enter the enclosed volume of 202, nor can it enter into or effect loads, circuits and devices located with the interior volume of enclosure 202. Using the non-electrically conductive feedthrough of the invention, electrical power and signals can be communicated to devices and circuits within enclosure 202 but electrical devices and circuits within enclosure 202 are protected from conducted and radiated emissions from outside enclosure 202.

Still referring to FIG. 9, the terms "ring" and "disk" are used for ease of reference, but not to imply that the shape of the "piezoelectric ring", "support ring" or "drive disk" are limited to be circular in plan shape. These elements may take any plan shape or configuration as may be desired for a particular use case. Thus, the shape of these elements may be determined by the physical and environmental constraints of a particular intended use.

The structure shown in FIG. 9 can, as with other embodiments of the invention, operate bidirectionally. That is, a source of time-varying electrical energy attached across electrical leads 908 and 909 may drive an electrical current $i_e$ through coil 906, generating time-varying magnetic field that operates on the magnets of magnet array 911, causing the magnet array 911 to be acted upon by the Lorentz force that results from the magnets of magnet array 911 being disposed in the time-varying magnetic field, the resulting Lorentz force driving the magnet array 911 back and forth in the direction of X, which in turn transmits energy to disk 903, transmitting vibrational energy proportional to the signal current $i_e$ into piezoelectric ring 901, producing a replica of signal $i_e$ across at 200 (which, in this case, may be a load). The use of the terms "input piezoelectric layer" and "output piezoelectric layer" herein are used for ease of reference, but these terms are not to be limiting as to the direction of the signal or energy transfer.

Herein, "signal" and "energy" are used interchangeably to describe the energy passing through the feedthrough. It is to be understood that the signal, or energy, passing through the feed through may be any signal of any characteristic that is able to be converted from electrical energy to mechanical vibrational energy and from mechanical vibrational energy to electrical energy using piezoelectric materials and techniques.

In any of the embodiments, the electrically conductive layer 109, 309 and the continuously electrically conductive sheet or enclosure forming the enclosed interior volume of enclosure 202 may optionally be, but is not required to be, connected to an electrical ground. In the figures, electrically conductive layer 109, 309 and enclosure 202 may be depicted as optionally connected to an electrical ground at a point 600. Such depiction is for convenience, and only depicts an exemplary, non-limiting embodiment. Such ground connection 600 is simply an optional embodiment of the invention. It is not necessary for each embodiment of the invention that any of these features be connected to an electrical ground, and, in fact, in some embodiments, it may be desired that electrically conductive layer 109, 309 and the electrically conductive walls of enclosure 202 not be connected to an electrical ground.

In the various embodiments of the invention, the various features described herein may be present in any combination, and in any quantity. The scope of the claimed invention includes not only all the various embodiments and features described herein, but all legal equivalents thereof.

In the embodiments of the invention, wherever an electrical signal is applied to a piezoelectric element or material, it is understood that the surface of the piezoelectric element or material that is in electrical contact with an electrical conductor has been electroded.

The various elements of the embodiments of the invention as described herein and depicted in the figures may be present in any embodiment, and in any combination or quantity.

INDUSTRIAL APPLICABILITY

Aa system and method for protecting electronic systems from failure or damage when such systems are subjected to undesired conducted or radiated energy such as electromagnetic pulse or electromagnetic interference. The invention also reduces the amount of conducted or radiated emanations from a system. A novel, non-conductive signal feedthrough allows a desired signal to be communicated with electrical connectivity. An incoming desired electrical signal is converted to vibrational energy by a piezoelectric transducer, which is communicated into an enclosed interior volume of a conductive electrical enclosure housing a system to be protected, where it is converted back to electrical energy for processing by the system to be protected by a second piezoelectric transducer. The signal feedthrough allows a continuous conductive enclosure to be employed, providing protection from undesired radiated energy. The signal feedthrough allows communication without requiring electrical conduction through the feedthrough, thus protecting against undesired conducted energy.

What is claimed is:

1. A signal feedthrough capable of providing designed energy to a system to be protected, while preventing unwanted energy from being provided to the system to be protected, comprising:

an input piezoelectric layer having a first surface and a second surface defining a first thickness of said input piezoelectric layer, said second surface of said input piezoelectric layer opposing said first surface of said input piezoelectric layer, said input piezoelectric layer having a first axis normal to said first and second surfaces; and an output piezoelectric layer having a third surface and a fourth surface defining a second thickness of said output piezoelectric layer, said fourth surface of said output piezoelectric layer opposing said third surface of said output piezoelectric layer, said output piezoelectric layer having a second axis normal to said third and fourth surfaces; wherein said first surface of said input piezoelectric layer is electroded;

said second surface of said input piezoelectric layer is in physical contact with an electrically conductive layer, wherein said electrically conductive layer comprises a groove containing an EMI mesh or other electrically conductive material providing continuous electrical contact between said electrically conductive layer and an electrically conductive enclosure;

said third surface is in physical contact with said electrically conductive layer; and said fourth surface of said output piezoelectric layer is electroded; and wherein said input piezoelectric layer is mechanically coupled to said output piezoelectric layer through said electrically conductive layer such that an input time-varying electrical signal applied to said first surface is converted to vibrational energy by said input piezoelectric layer, and wherein said vibrational energy is transmitted through said electrically conductive layer to said output piezoelectric layer, wherein said vibrational energy is converted back into a time-varying electrical signal, resulting in a replica of the input time-varying electrical signal being present on said fourth surface of said output piezoelectric layer;

wherein there is no electrically conductive path between said electroded first surface on said input piezoelectric layer and said electroded fourth surface on said output piezoelectric layer;

wherein the signal feedthrough is further defined as having a desired natural frequency within a frequency bandwidth defined by a lower cutoff frequency limit and an upper cutoff frequency limit, such that a desired time-varying electrical signal having a bandwidth within the bandwidth defined by the lower cutoff frequency and the upper cutoff frequency is transmitted through the electrically conductive layer to the output piezoelectric layer, and energy falling below the lower cutoff frequency limit and the upper cutoff frequency limit is not transmitted through the electrically conductive layer to said output piezoelectric layer; the desired natural frequency determined by selecting one or more of piezoelectric materials, mass and length.

2. The signal feedthrough of claim 1, wherein said input piezoelectric layer is further defined as comprising a ceramic piezoelectric material, and wherein said output piezoelectric layer is further defined as comprising a ceramic piezoelectric material.

3. The signal feedthrough of claim 1, wherein said input piezoelectric layer is polarized in a direction parallel to said first axis, and said output piezoelectric layer is polarized in a direction parallel to said second axis.

4. The signal feedthrough of claim 3, wherein said input piezoelectric layer and said output piezoelectric layer are coaxially disposed with one another.

5. The signal feedthrough of claim 1, wherein said second thickness is greater than said first thickness.

6. The signal feedthrough of claim 1, further comprising a rigid end-mass attached to said electroded fourth surface on said output piezoelectric layer, said rigid end-mass having a mechanical quality factor greater than a mechanical quality factor of said output piezoelectric layer.

7. The signal feedthrough of claim 1, further comprising a rigid end-mass attached to said electroded first surface on said input piezoelectric layer, said rigid end-mass having a mechanical quality factor greater than a mechanical quality factor of said input piezoelectric layer.

8. A protection system for reducing the susceptibility of an electrical system to undesired radiated or conducted energy, while allowing desired electrical energy to be provided to the electrical system, comprising:

a continuously electrically conductive enclosure forming a three-dimensional structure having an enclosed interior volume for receiving the electrical system;

said continuously electrically conductive enclosure comprising a wall;

a signal feedthrough passing through said wall of said electrically conductive enclosure, said signal feedthrough having an input end and an output end;

said signal feedthrough able to be electrically coupled to a source of time-varying electrical energy on said input side, receiving input time-varying electrical energy from said source of time-varying electrical energy, convert said input time-varying electrical energy to time-varying mechanical energy representative of said input time-varying electrical energy, transmit said time-varying mechanical energy to said output end of said signal feedthrough, and convert, at the output end, said time-varying mechanical energy to output time-varying electrical energy that is representative of said input time-varying electrical energy;

wherein said input said and said output side of said signal feedthrough are located on opposite sides of a wall of said continuously electrically conductive enclosure, such that either the input side of said signal feedthrough is exterior to said enclosed interior volume and said output said of said signal feedthrough is inside said enclosed interior volume, or said output side of said signal feedthrough is exterior to said enclosed interior volume and said input side of said signal feedthrough is inside said enclosed interior volume;

wherein said signal feedthrough does not provide an electrically conductive path from outside the continuously electrically conductive enclosure to inside the continuously electrically conductive enclosure;

and wherein said signal feedthrough does not provide a path for radiated electromagnetic energy to pass from said outside environment into said enclosed interior volume;

said signal feedthrough comprising an continuous, uninterrupted electrically conductive layer completely covering a cross section of the signal feedthrough, wherein said electrically conductive layer comprises a periphery external to the signal feedthrough that is in uninterrupted electrical contact with a conductive surface of said electrically conductive enclosure, such that radiated energy from outside the electrically conductive enclosure does not pass into said enclosed interior volume;

wherein said electrically conductive layer comprises a groove containing an EMI mesh or other electrically conductive material providing continuous electrical contact of said electrically conductive enclosure;

wherein said signal feedthrough is further defined as having a desired natural frequency within a frequency bandwidth defined by a lower cutoff frequency limit and an upper cutoff frequency limit, such that a desired time-varying electrical signal having a bandwidth within the bandwidth defined by the lower cutoff frequency and the upper cutoff frequency is transmitted through the electrically conductive layer to an output piezoelectric layer, and energy falling below the lower cutoff frequency limit and the upper cutoff frequency limit is not transmitted through the electrically conductive layer to said output piezoelectric layer; the desired natural frequency determined by selecting one or more of piezoelectric materials, mass and length.

9. The protection system of claim 8, wherein said conversion of electrical energy to mechanical energy and said conversion of mechanical energy to electrical energy is accomplished using the piezoelectric materials.

10. The protection system of claim 9, wherein said signal feedthrough is further defined as comprising:

an input piezoelectric layer having a first surface and a second surface defining a first thickness of said input piezoelectric layer, said second surface of said input piezoelectric layer opposing said first surface of said input piezoelectric layer, said input piezoelectric layer having a first axis normal to said first and second surfaces; and an output piezoelectric layer having a third surface and a fourth surface defining a second thickness of said output piezoelectric layer, said fourth surface of said output piezoelectric layer opposing said third surface of said output piezoelectric layer, said output piezoelectric layer having a second axis normal to said third and fourth surfaces; wherein said first surface of said input piezoelectric layer is electroded;

said second surface of said input piezoelectric layer is in physical contact with said electrically conductive layer;

said third surface is in physical contact with said electrically conductive layer; and said fourth surface of said output piezoelectric layer is electroded; and wherein said input piezoelectric layer is mechanically coupled to said output piezoelectric layer through said electrically conductive layer such that a time-varying electrical signal applied to said first surface is converted to time-varying mechanical energy that is transmitted through said electrically conductive enclosure to said output piezoelectric layer, resulting in a replica of the time-varying electrical signal being present on said fourth surface of said output piezoelectric layer;

wherein there is no electrically conductive path between said electroded first surface on said input piezoelectric layer and said electroded fourth surface on said output piezoelectric layer; and wherein said electrically conductive layer comprises a periphery, and wherein said periphery is in uninterrupted electrical contact with said electrically conductive enclosure.

11. The protection system of claim 10, wherein said input piezoelectric layer is further defined as comprising a ceramic piezoelectric material, and wherein said output piezoelectric layer is further defined as comprising a ceramic piezoelectric material.

12. The protection system of claim 10, wherein said input piezoelectric layer is polarized in a direction parallel to said first axis, and said output piezoelectric layer is polarized in a direction parallel to said second axis.

13. The protection system of claim 8, wherein said electrically conductive enclosure is further defined as comprising a continuously electrically conductive sheet completely covering a cross section of said signal feedthrough.

14. The protection system of claim 8, wherein said electrically conductive enclosure is further defined as comprising mu-metal.

15. A method for reducing the susceptibility of an electrical system to undesired energy, while allowing desired energy to be provided to, or received from, the electrical system, comprising:

enclosing the electrical system in an enclosed interior volume of an electrically conductive enclosure completely enclosing said enclosed interior volume with electrically conductive surfaces;

providing a signal feedthrough passing through said electrically conductive enclosure allowing desired energy to be communicated to the electrical system, wherein said signal feedthrough does not provide an electrically conductive path between said outside environment and said system to be protected, and wherein said signal feedthrough does not provide a path for radiated electromagnetic energy to pass from said outside environment into said enclosed interior volume;

said signal feedthrough comprising an electrically conductive layer, wherein said electrically conductive layer comprises a periphery that is in uninterrupted electrical contact with said electrically conductive enclosure such that radiated energy from said outside environment does not pass into said enclosed interior volume;

said electrically conductive layer further comprising a groove containing an EMI mesh or other electrically conductive material providing continuous electrical contact of said electrically conductive enclosure;

wherein said signal feedthrough is further defined as having a desired natural frequency within a frequency bandwidth defined by a lower cutoff frequency limit and an upper cutoff frequency limit, such that a desired time-varying electrical signal having a bandwidth within the bandwidth defined by the lower cutoff frequency and the upper cutoff frequency is transmitted through the electrically conductive layer to an output piezoelectric layer, and energy falling below the lower cutoff frequency limit and the upper cutoff frequency limit is not transmitted through the electrically conductive layer to said output piezoelectric layer; the desired natural frequency determined by selecting one or more of piezoelectric materials, mass and length; and wherein said signal feedthrough communicates a source of desired energy to said electrical system via an electrically non-conductive mechanical coupling.

16. The method of claim 15, wherein a conversion of electrical energy to mechanical energy and a conversion of mechanical energy to electrical energy is accomplished using the piezoelectric materials.

17. The method of claim 15, wherein said signal feedthrough is further defined as comprising:

an input piezoelectric layer having a first surface and a second surface defining a first thickness of said input piezoelectric layer, said second surface of said input piezoelectric layer opposing said first surface of said input piezoelectric layer, said input piezoelectric layer having a first axis normal to said first and second surfaces; and an output piezoelectric layer having a third surface and a fourth surface defining a second thickness of said output piezoelectric layer, said fourth surface of said output piezoelectric layer opposing said third surface of said output piezoelectric layer, said output piezoelectric layer having a second axis normal to said third and fourth surfaces; wherein said first surface of said input piezoelectric layer is electroded;

said second surface of said input piezoelectric layer is in physical contact with said electrically conductive layer;

said third surface is in physical contact with said electrically conductive layer; and said fourth surface of said output piezoelectric layer is electroded; and wherein said input piezoelectric layer is mechanically coupled to said output piezoelectric layer through said electrically conductive layer such that a time-varying electrical signal applied to said first surface is converted to vibrational energy that is transmitted through said electrically conductive layer to said output piezoelectric layer, resulting in a replica of the time-varying electrical signal being present on said fourth surface of said output piezoelectric layer;

wherein there is no electrically conductive path between said electroded first surface on said input piezoelectric layer and said electroded fourth surface on said output piezoelectric layer; and wherein said electrically conductive layer comprises a periphery, and wherein said periphery is in uninterrupted electrical contract with said electrically conductive enclosure.

18. The method of claim 17, wherein said input piezoelectric layer is further defined as comprising a ceramic piezoelectric material, and wherein said output piezoelectric layer is further defined as comprising a ceramic piezoelectric material.

19. The method of claim 17, wherein said input piezoelectric layer is polarized in a direction parallel to said first axis, and said output piezoelectric layer is polarized in a direction parallel to said second axis.

20. The method of claim 15, wherein the electrically conductive enclosure further comprising a continuously electrically conductive sheet.

21. The method of claim 15, wherein the electrically conductive enclosure further comprising mu-metal.

22. A signal feedthrough capable of providing designed energy to a system to be protected, while preventing unwanted energy from being provided to the system to be protected, comprising:

an input structure for receiving an input desired signal;

an input transducer in communication with said input structure for converting the received input desired signal to mechanical energy representing the input desired signal, said input transducer in communication with said input structure; and the signal feedthrough communicating the mechanical energy through an electrically conductive layer to a receiving output transducer;

wherein said receiving output transducer is adapted to receive the mechanical energy and convert it to an output signal that is a replica of the received input desired signal;

wherein there is no electrically conductive path through the signal feedthrough;

said electrically conductive layer further comprising a groove containing an EMI mesh or other electrically conductive material providing continuous electrical contact of an electrically conductive enclosure;

wherein said signal feedthrough is further defined as having a desired natural frequency within a frequency bandwidth defined by a lower cutoff frequency limit and an upper cutoff frequency limit, such that a desired time-varying electrical signal having a bandwidth within the bandwidth defined by the lower cutoff frequency and the upper cutoff frequency is transmitted through the electrically conductive layer to an output piezoelectric layer, and energy falling below the lower cutoff frequency limit and the upper cutoff frequency limit is not transmitted through the electrically conductive layer to said output piezoelectric layer; the desired natural frequency determined by selecting one or more of piezoelectric materials, mass and length.

23. The signal feedthrough of claim 22, wherein said input transducer and said receiving output transducer are electromechanical devices.

24. The signal feedthrough of claim 22, wherein said input transducer and said receiving output transducer are electroactive devices.

25. The signal feedthrough of claim 22, wherein said input transducer and said receiving output transducer are piezoelectric devices.

* * * * *